United States Patent
Arakawa et al.

(10) Patent No.: US 11,205,974 B2
(45) Date of Patent: Dec. 21, 2021

(54) PIEZOELECTRIC DRIVING DEVICE, PIEZOELECTRIC MOTOR, ROBOT, ELECTRONIC COMPONENT CONVEYANCE APPARATUS, PRINTER, AND PROJECTOR

(71) Applicant: Seiko Epson Corporation, Tokyo (JP)

(72) Inventors: Yutaka Arakawa, Hara-mura (JP); Akio Konishi, Matsumoto (JP); Tomoaki Takahashi, Matsumoto (JP)

(73) Assignee: Seiko Epson Corporation

( * ) Notice: Subject to any disclaimer, the term of this patent is extended or adjusted under 35 U.S.C. 154(b) by 491 days.

(21) Appl. No.: 16/193,040

(22) Filed: Nov. 16, 2018

(65) Prior Publication Data
US 2019/0157991 A1 May 23, 2019

(30) Foreign Application Priority Data
Nov. 17, 2017 (JP) .............................. JP2017-221561

(51) Int. Cl.
| | |
|---|---|
| H02N 2/10 | (2006.01) |
| H01L 41/053 | (2006.01) |
| H01L 41/08 | (2006.01) |
| H02N 2/14 | (2006.01) |
| G02B 7/04 | (2021.01) |
| B25J 9/00 | (2006.01) |
| B65G 23/00 | (2006.01) |
| B41J 2/14 | (2006.01) |
| H01L 21/677 | (2006.01) |
| B25J 9/12 | (2006.01) |
| G03B 21/00 | (2006.01) |

(52) U.S. Cl.
CPC ............ *H02N 2/103* (2013.01); *B25J 9/0009* (2013.01); *B25J 9/12* (2013.01); *B41J 2/14201* (2013.01); *B65G 23/00* (2013.01); *G02B 7/04* (2013.01); *H01L 21/67706* (2013.01); *H01L 41/0533* (2013.01); *H01L 41/0536* (2013.01); *H01L 41/0825* (2013.01); *H02N 2/145* (2013.01); *G03B 21/006* (2013.01)

(58) Field of Classification Search
CPC .... H02N 2/103; H02N 2/145; H01L 41/0533; H01L 41/0536; H01L 41/0825
USPC ........................................ 310/323.01–323.21
See application file for complete search history.

(56) References Cited

U.S. PATENT DOCUMENTS

2015/0158184 A1    6/2015   Kamijo et al.
2016/0294306 A1* 10/2016   Kobayashi ............ F04B 43/046
(Continued)

FOREIGN PATENT DOCUMENTS

| JP | 2015-111966 A | 6/2015 |
|---|---|---|
| JP | 2017-017916 A | 1/2017 |

(Continued)

*Primary Examiner* — Derek J Rosenau
(74) *Attorney, Agent, or Firm* — Harness, Dickey & Pierce, P.L.C.

(57) ABSTRACT

A piezoelectric driving device includes a first substrate having cleavability, and a piezoelectric element placed above the first substrate, wherein a cleavage direction of the first substrate and a direction in which a shear force is applied do not coincide in a plan view of the first substrate. Further, an angle formed by the cleavage direction of the first substrate and the direction in which the shear force is applied is equal to or larger than 20° in the plan view of the first substrate. Furthermore, the first substrate contains silicon single crystal.

20 Claims, 17 Drawing Sheets

(56) References Cited

U.S. PATENT DOCUMENTS

2017/0001306 A1    1/2017   Arakawa et al.
2017/0162780 A1*   6/2017   Takahashi ............ F04B 43/082
2018/0062065 A1    3/2018   Arakawa et al.
2018/0090663 A1    3/2018   Arakawa

FOREIGN PATENT DOCUMENTS

JP    2018-038188 A    3/2018
JP    2018-050435 A    3/2018

* cited by examiner

PIEZOELECTRIC DRIVING DEVICE, PIEZOELECTRIC MOTOR, ROBOT, ELECTRONIC COMPONENT CONVEYANCE APPARATUS, PRINTER, AND PROJECTOR

BACKGROUND

1. Technical Field

The present invention relates to a piezoelectric driving device, piezoelectric motor, robot, electronic component conveyance apparatus, printer, and projector.

2. Related Art

In related art, as a piezoelectric driving device, e.g. a configuration disclosed in Patent Document 1 (JP-A-2017-17916) is known. The piezoelectric driving device in Patent Document 1 has a silicon substrate (single-crystal silicon substrate) including a vibrating part and a supporting part that supports the vibrating part, and a plurality of piezoelectric elements for driving are placed in the vibrating part. The plurality of piezoelectric elements are expanded and contracted at predetermined times, and thereby, the vibrating part is flexurally vibrated.

The silicon substrate has cleavability (a tendency of a silicon crystal to break or split along a cleavage face or plane), however, the relationship between the direction of a shear force applied to the silicon substrate when the piezoelectric driving device is driven and the cleavage direction (a direction in which the silicon crystal is broken or split along the cleavage face or plane with respect to a reference surface) of the silicon substrate is not explicitly stated in Patent Document 1. If the cleavage direction of the silicon substrate and the direction of the shear force coincide, there are problems that the silicon substrate is easily broken and the mechanical strength of the piezoelectric driving device decreases.

SUMMARY

An advantage of some aspects of the invention is to provide a piezoelectric driving device having high mechanical strength, and a highly-reliable piezoelectric motor, robot, electronic component conveyance apparatus, printer, and projector including the piezoelectric driving device.

The advantage can be achieved by the following configurations.

A piezoelectric driving device according to an aspect of the invention includes a first substrate having cleavability, and a piezoelectric element placed on the first substrate, wherein a cleavage direction of the first substrate and a direction in which a shear force is applied do not coincide in a plan view of the first substrate.

With this configuration, the first substrate is harder to be cleaved and the piezoelectric driving device having high mechanical strength is obtained.

In the piezoelectric driving device according to the aspect of the invention, it is preferable that an angle formed by the cleavage direction of the first substrate and the direction in which the shear force is applied is equal to or larger than 20° in the plan view of the first substrate.

With this configuration, the first substrate is even harder to be cleaved.

In the piezoelectric driving device according to the aspect of the invention, it is preferable that the first substrate contains silicon single crystal.

With this configuration, the first substrate can be formed with higher dimensional accuracy by e.g. etching or the like.

In the piezoelectric driving device according to the aspect of the invention, it is preferable that the first substrate has a vibrating portion on which the piezoelectric element is placed, a supporting portion that supports the vibrating portion, and a connecting portion that connects the vibrating portion and the supporting portion.

With this configuration, the vibrating portion can be efficiently flexurally vibrated.

In the piezoelectric driving device according to the aspect of the invention, it is preferable that a pair of the first substrates are provided with the piezoelectric element in between.

With this configuration, the piezoelectric driving device has a symmetrical shape with respect to the thickness direction, and the vibration of the piezoelectric driving device in the out-of-plane direction can be suppressed.

In the piezoelectric driving device according to the aspect of the invention, it is preferable that an oxide film is formed on at least a part of a surface of the first substrate.

With this configuration, regularity of the crystal in the surface of the first substrate is broken and the first substrate is even harder to be cleaved.

In the piezoelectric driving device according to the aspect of the invention, it is preferable that an urging part that urges the first substrate toward an object is provided, the urging part has cleavability and has a second substrate that supports the first substrate, and a cleavage direction of the second substrate and the direction in which the shear force is applied do not coincide in a plan view of the second substrate.

With this configuration, the the second substrate is harder to be cleaved (broken) and the piezoelectric driving device having high mechanical strength is obtained.

In the piezoelectric driving device according to the aspect of the invention, it is preferable that an angle formed by the cleavage direction of the second substrate and the direction in which the shear force is applied is equal to or larger than 20° in the plan view of the second substrate.

With this configuration, the second substrate is even harder to be cleaved (broken).

In the piezoelectric driving device according to the aspect of the invention, it is preferable that the second substrate contains silicon single crystal.

With this configuration, the second substrate can be formed with higher dimensional accuracy by e.g. etching or the like.

In the piezoelectric driving device according to the aspect of the invention, it is preferable that the second substrate has a base portion to which the first substrate is fixed, and a spring portion connected to the base portion.

With this configuration, the spring portion is bent and fixed, and thereby, the first substrate can be easily urged.

In the piezoelectric driving device according to the aspect of the invention, it is preferable that a pair of the second substrates are provided with the piezoelectric element in between.

With this configuration, the urging part has a symmetrical shape with respect to the thickness direction, and, for example, inclination of the first substrate in the out-of-plane direction or the like can be suppressed.

In the piezoelectric driving device according to the aspect of the invention, it is preferable that an oxide film is formed on at least a part of a surface of the second substrate.

With this configuration, regularity of the crystal in the surface of the second substrate is broken and the second substrate is even harder to be cleaved.

A piezoelectric motor according to an aspect of the invention includes the piezoelectric driving device according to the aspect of the invention, and a driven part in contact with the piezoelectric driving device.

With this configuration, the highly reliable piezoelectric motor that can enjoy the benefit of the piezoelectric driving device according to the aspect of the invention is obtained.

A robot according to an aspect of the invention includes the piezoelectric driving device according to the aspect of the invention.

With this configuration, the highly reliable robot that can enjoy the benefit of the piezoelectric driving device according to the aspect of the invention is obtained.

An electronic component conveyance apparatus according to an aspect of the invention includes the piezoelectric driving device according to the aspect of the invention.

With this configuration, the highly reliable electronic component conveyance apparatus that can enjoy the benefit of the piezoelectric driving device according to the aspect of the invention is obtained.

A printer according to an aspect of the invention includes the piezoelectric driving device according to the aspect of the invention.

With this configuration, the highly reliable printer that can enjoy the benefit of the piezoelectric driving device according to the aspect of the invention is obtained.

A projector according to an aspect of the invention includes the piezoelectric driving device according to the aspect of the invention.

With this configuration, the highly reliable projector that can enjoy the benefit of the piezoelectric driving device according to the aspect of the invention is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a piezoelectric driving device, a piezoelectric motor, a robot, an electronic component conveyance apparatus, a printer, and a projector according to the invention will be explained in detail based on embodiments shown in the accompanying drawings.

First Embodiment

First, a piezoelectric motor according to the first embodiment of the invention will be explained.

Figure 1:
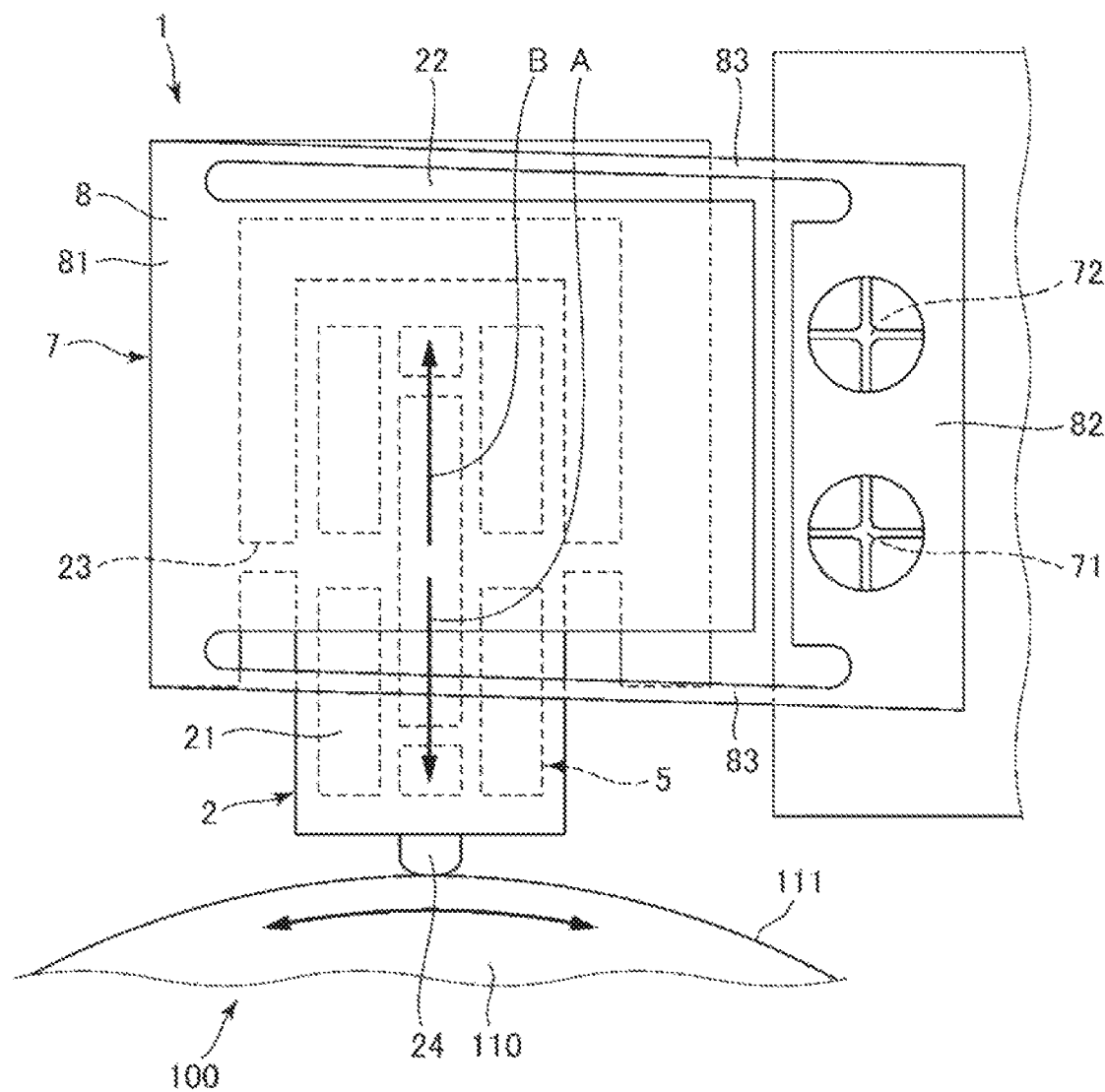
FIG. 1 is a plan view showing an overall configuration of a piezoelectric motor according to the first embodiment of the invention.
Figure 2:
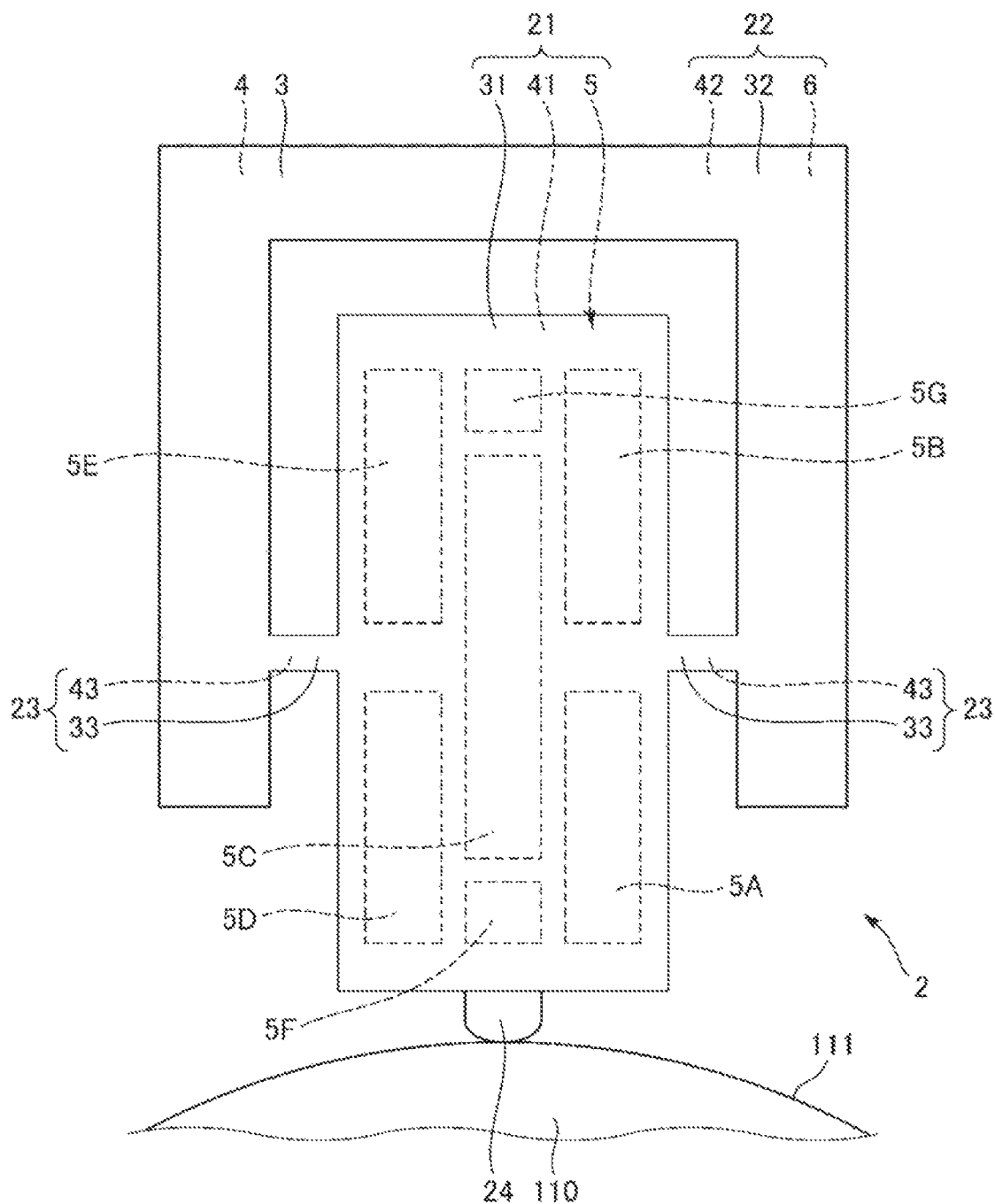
FIG. 2 is a plan view showing a driving device main body of a piezoelectric driving device.
Figure 3:
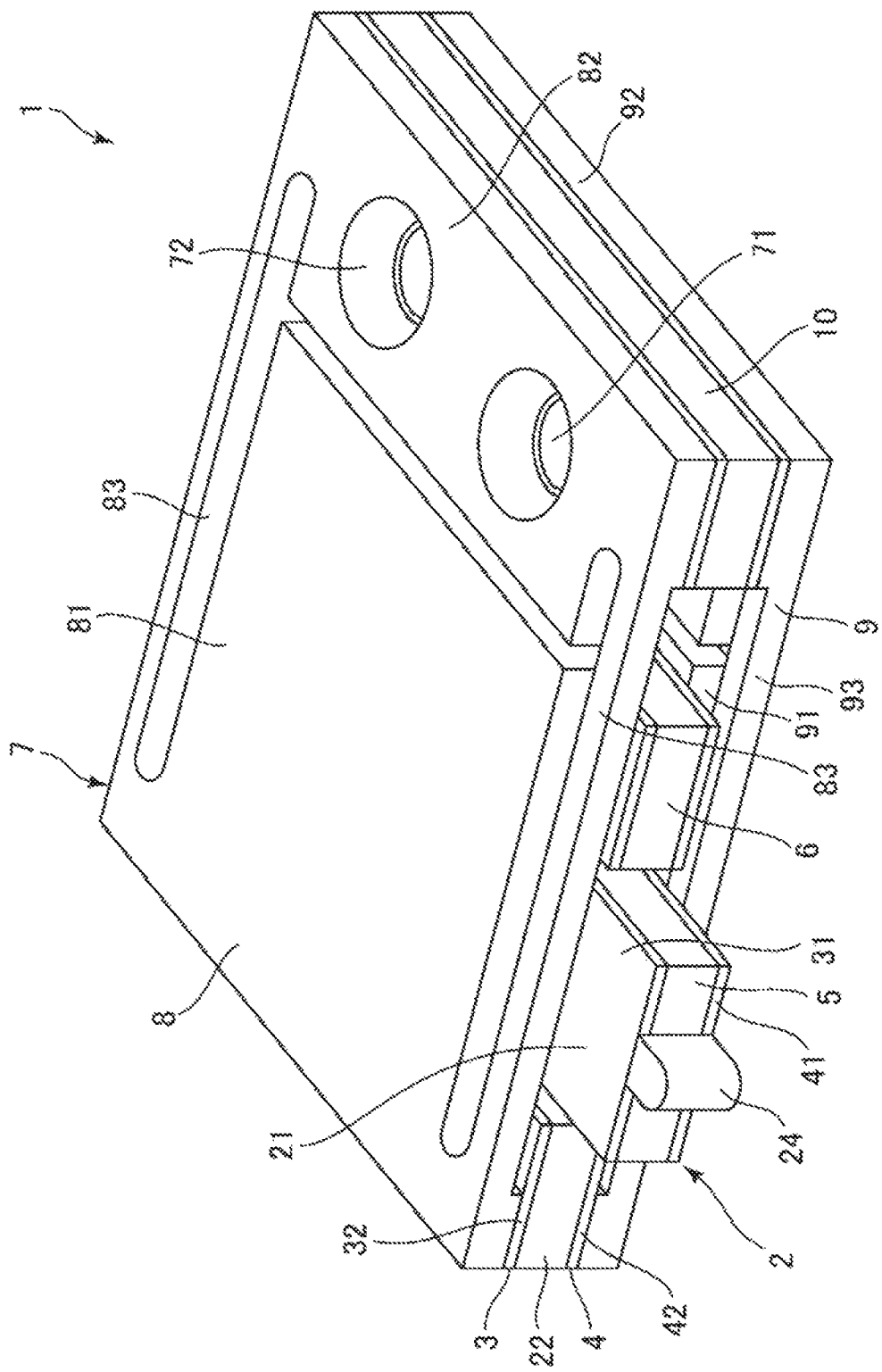
FIG. 3 is a perspective view of the piezoelectric driving device.
Figure 4:
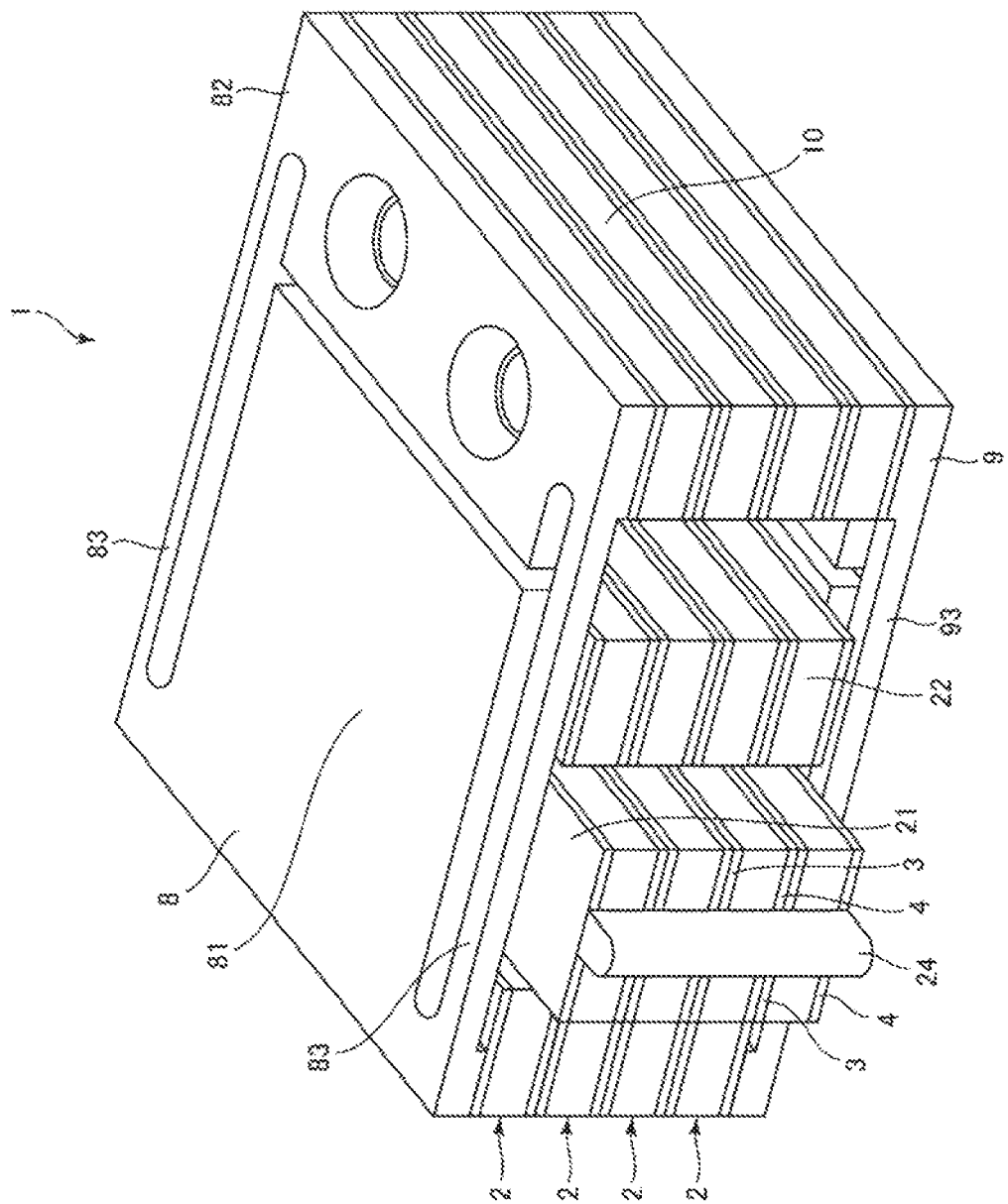
FIG. 4 is a perspective view showing a modified example of the piezoelectric driving device.
Figure 5:
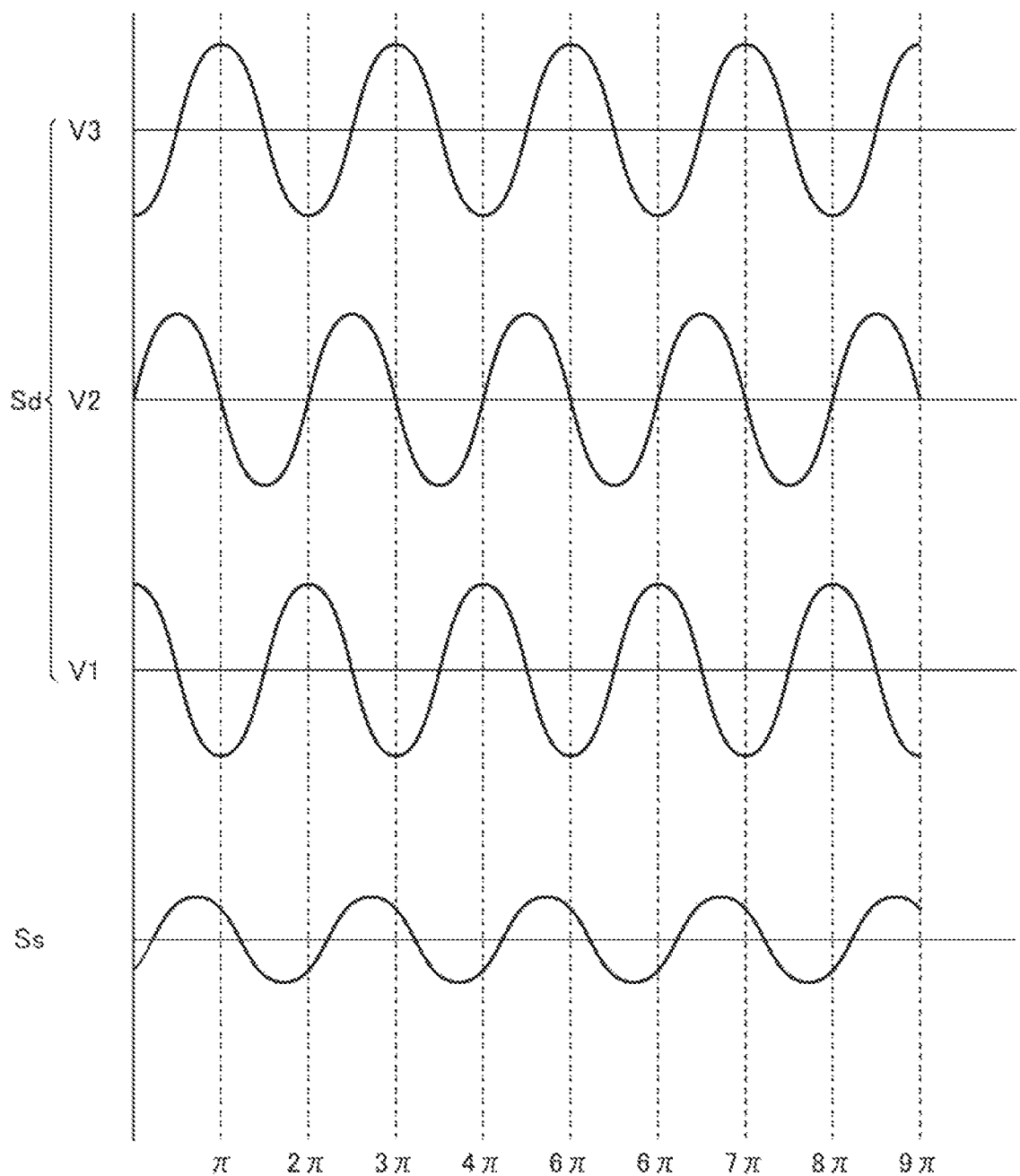
FIG. 5 shows voltages applied to the piezoelectric driving device.
Figure 6:
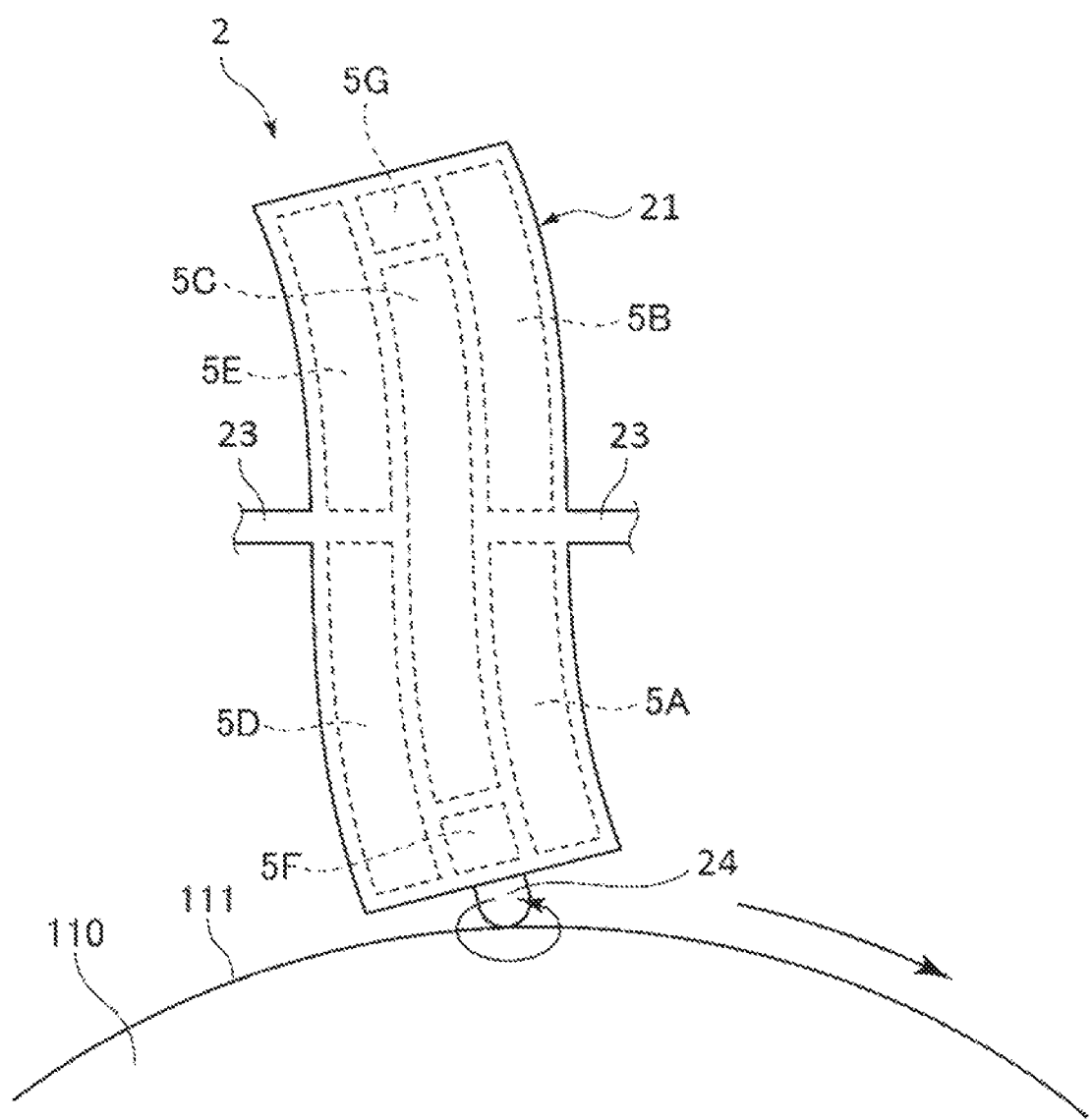
FIG. 6 shows driving of the piezoelectric motor when the voltages shown in FIG. 5 are applied.
Figure 7:
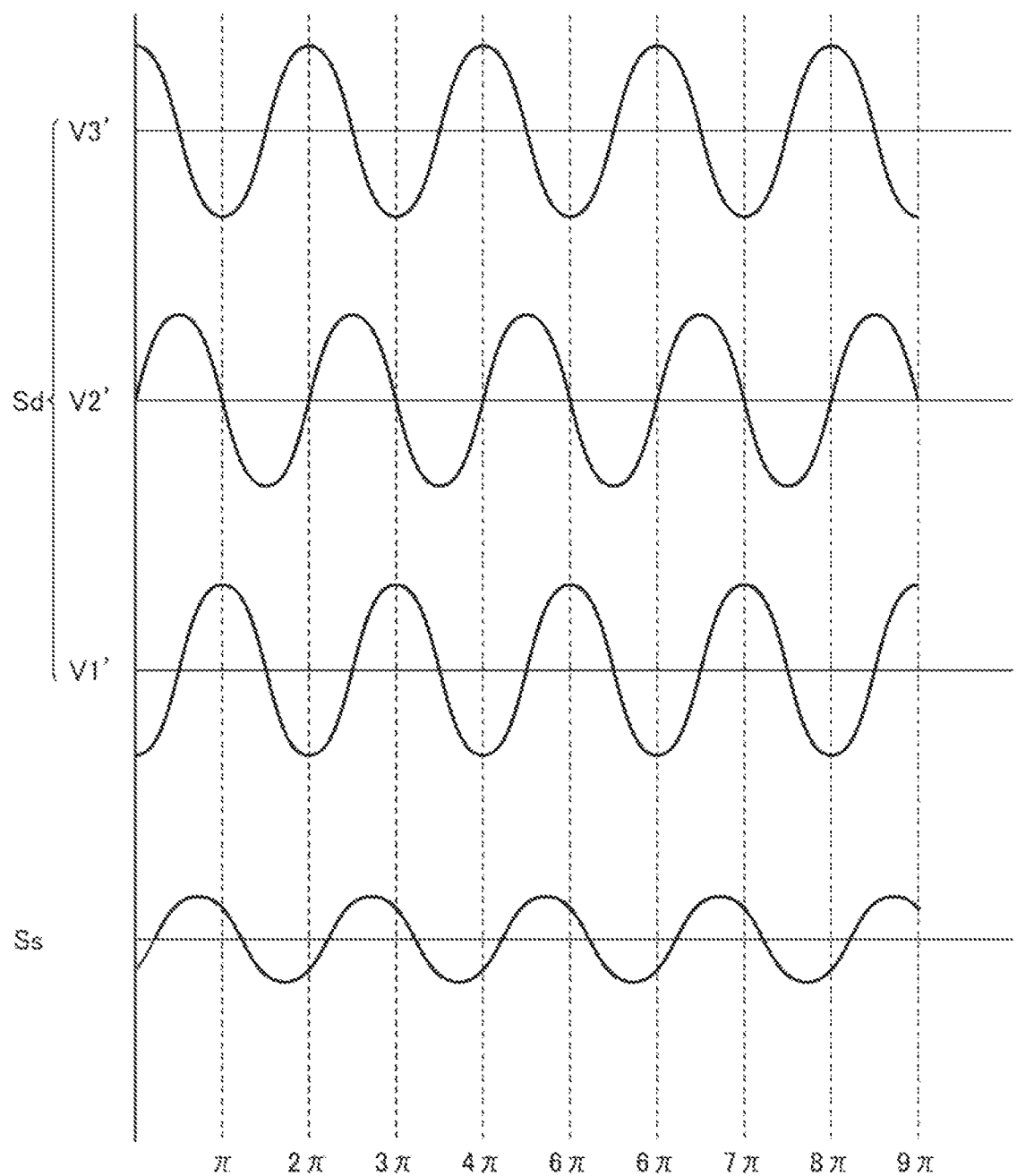
FIG. 7 shows voltages applied to the piezoelectric driving device.
Figure 8:
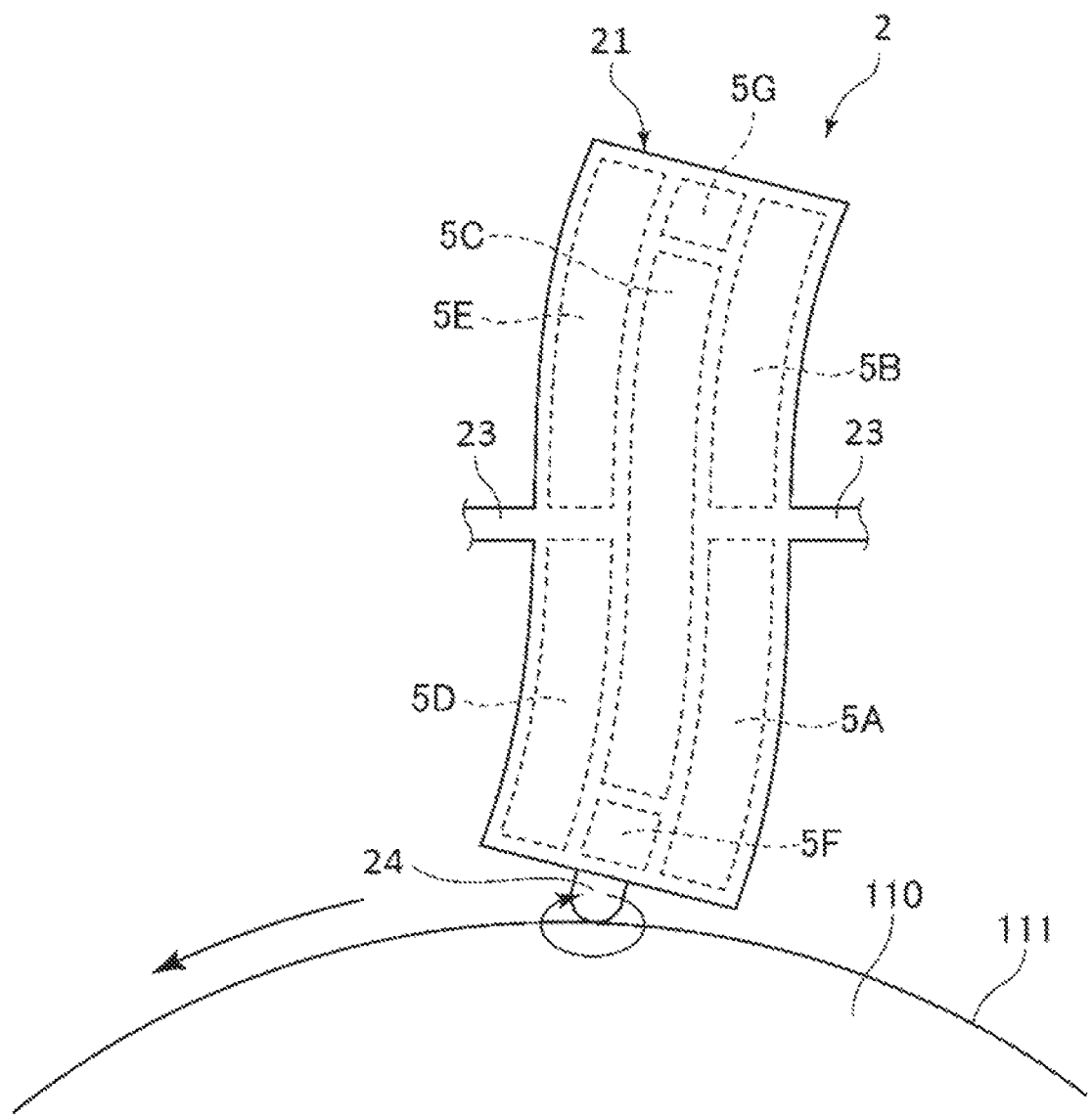
FIG. 8 shows driving of the piezoelectric motor when the voltages shown in FIG. 7 are applied.
Figure 9:
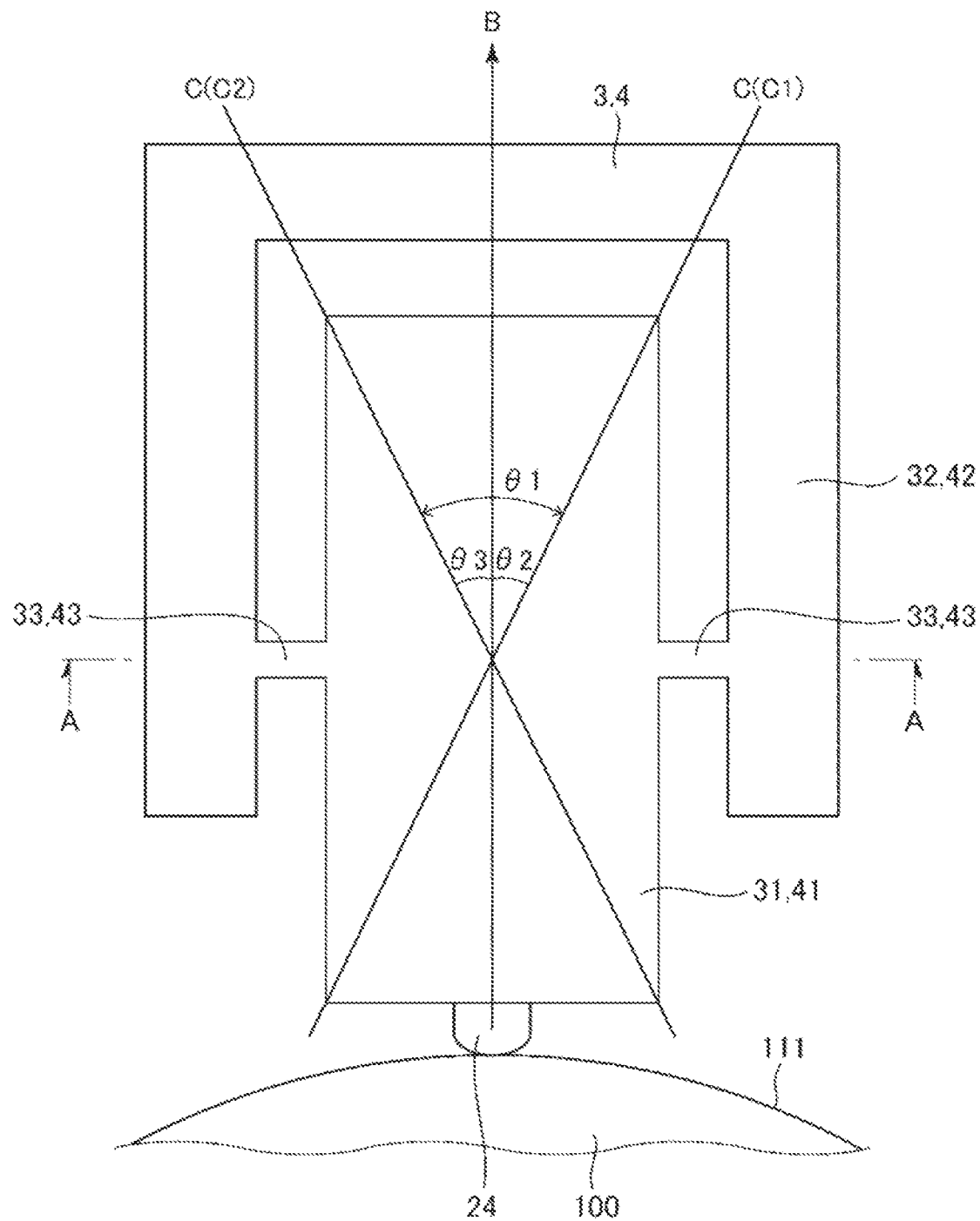
FIG. 9 is a plan view showing a relationship between a cleavage direction of a substrate and a direction of a shear force.
Figure 10:
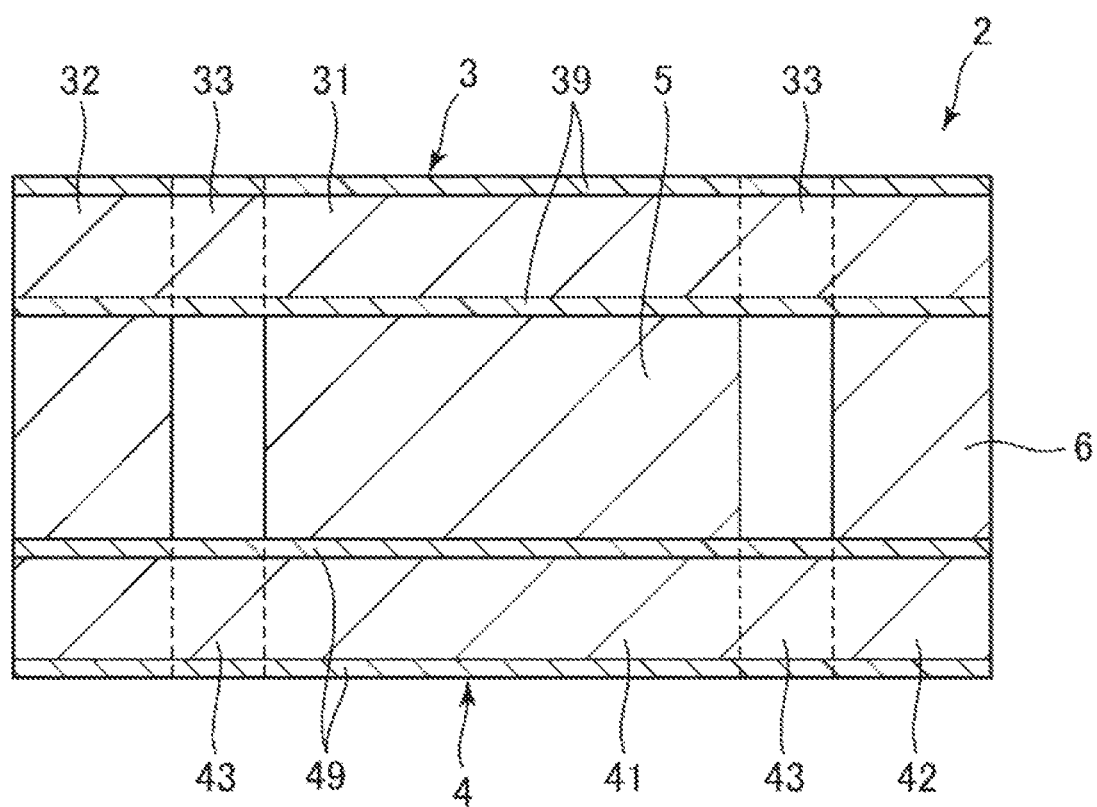
FIG. 10 is a sectional view along line A-A in FIG. 9.
Figure 11:
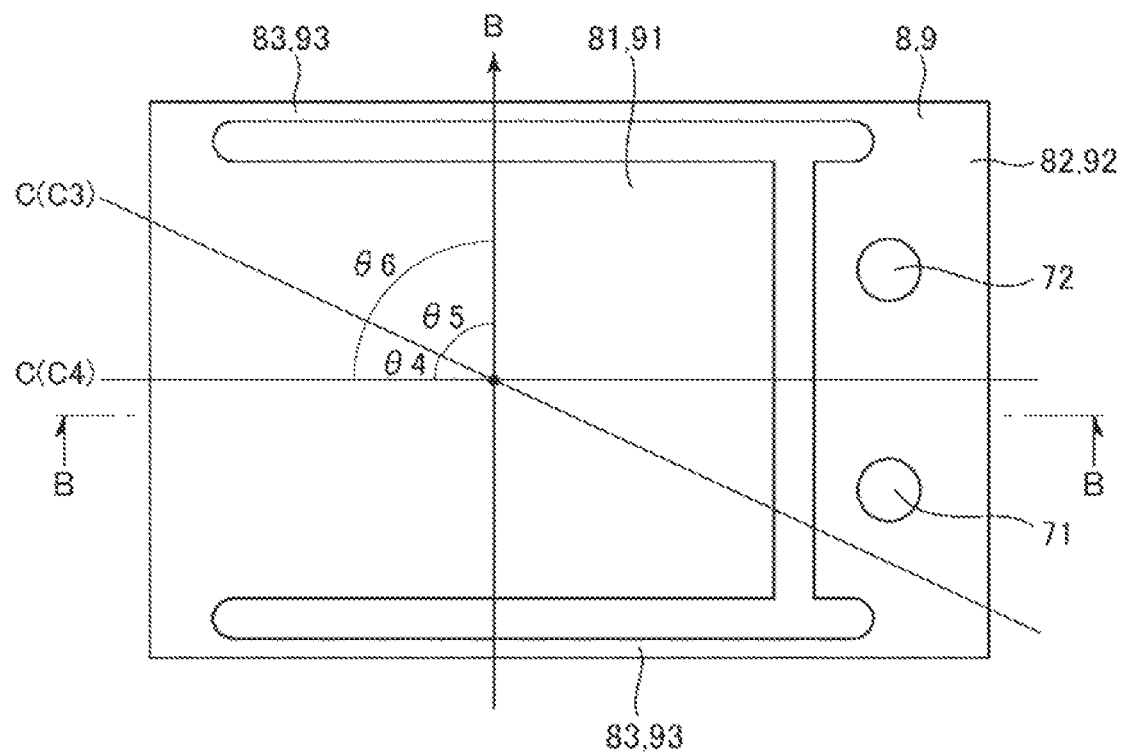
FIG. 11 is a plan view showing a relationship between a cleavage direction of a substrate and a direction of a shear force.
Figure 12:
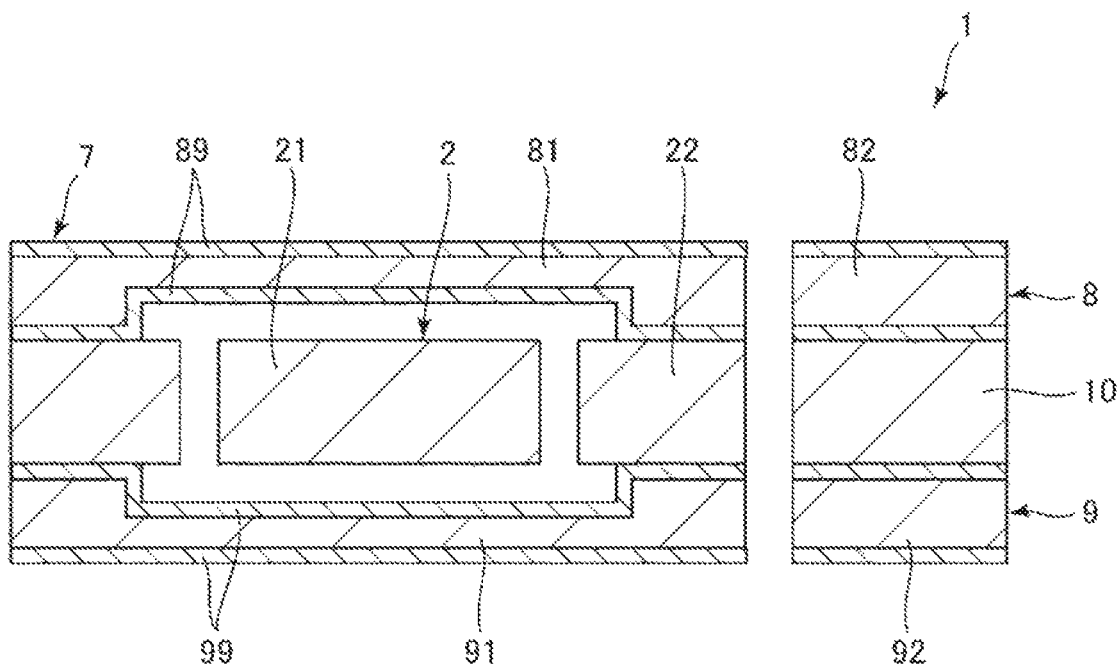
FIG. 12 is a sectional view along line B-B in FIG. 11.

FIG. 1 is a plan view showing an overall configuration of the piezoelectric motor according to the first embodiment of the invention. FIG. 2 is a plan view showing a driving device main body of a piezoelectric driving device. FIG. 3 is a perspective view of the piezoelectric driving device. FIG. 4 is a perspective view showing a modified example of the piezoelectric driving device. FIG. 5 shows voltages applied to the piezoelectric driving device. FIG. 6 shows driving of the piezoelectric motor when the voltages shown in FIG. 5 are applied. FIG. 7 shows voltages applied to the piezoelectric driving device. FIG. 8 shows driving of the piezoelectric motor when the voltages shown in FIG. 7 are applied. FIG. 9 is a plan view showing a relationship between a cleavage direction of a substrate and a direction of a shear force. FIG. 10 is a sectional view along line A-A in FIG. 9. FIG. 11 is a plan view showing a relationship between a cleavage direction of a substrate and a direction of a shear force. FIG. 12 is a sectional view along line B-B in FIG. 11. Hereinafter, for convenience of explanation, the side of a rotor 110 of a piezoelectric driving device 1 is also referred to as "distal end side" and the opposite side to the rotor 110 is also referred to as "proximal end side".

A piezoelectric motor 100 (ultrasonic motor) shown in FIG. 1 has the rotor 110 as a driven part rotatable about a rotation shaft, and the piezoelectric driving device 1 in contact with an outer circumferential surface 111 of the rotor 110. Further, the piezoelectric driving device 1 has a driving device main body 2 and an urging part 7 that urges the driving device main body 2 toward the outer circumferential surface 111, and the driving device main body 2 (a transmitting portion 24, which will be described later) is urged by the urging part 7 into contact with the rotor 110 with an appropriate frictional force. In the piezoelectric motor 100, the driving device main body 2 is flexurally vibrated, and thereby, the rotor 110 can be rotated about the rotation shaft.

Note that the configuration of the piezoelectric motor 100 is not limited to the configuration in FIG. 1. For example, a plurality of the piezoelectric driving devices 1 may be placed along the circumferential direction of the rotor 110 and the rotor 110 may be rotated by driving of the plurality of piezoelectric driving devices 1. According to the configuration, the piezoelectric motor 100 that can generate higher drive power and a higher rotation speed is obtained. Or, in the piezoelectric driving device 1, the transmitting portion 24 may be in contact with principal surfaces (a pair of opposed flat surfaces), not the side surface of the rotor 110. Or, the driven part is not limited to a rotating object such as the rotor 110, but may be e.g. a moving object that linearly moves.

As shown in FIG. 1, the driving device main body 2 (piezoelectric actuator) has a vibrator 21, a supporting portion 22 that supports the vibrator 21, a connecting portion 23 that connects the vibrator 21 and the supporting portion 22, and the transmitting portion 24 provided on the vibrator 21 and transmitting the vibration of the vibrator 21 to the rotor 110.

As will be described later, the vibrator 21 is apart that flexurally vibrates in S-shapes by flexing while expanding and contracting. The vibrator 21 has a longitudinal shape that expands and contacts in the longitudinal directions in the plan view from the thickness direction of the driving device main body 2. The supporting portion 22 supports the vibrator 21 and functions as a fixing portion that fixes the driving device main body 2 to the urging part 7. The supporting portion 22 has a U-shape surrounding the proximal end side of the vibrator 21 in the plan view from the thickness direction of the driving device main body 2. Further, the connecting portion 23 connects a portion to be a node (the center portion in the longitudinal direction) of the flexural vibration of the vibrator 21 and the supporting portion 22. Note that the shapes and placements of the vibrator 21, the supporting portion 22, and the connecting portion 23 are respectively not particularly limited as long as the parts may exert the functions. Or, the supporting portion 22 and the connecting portion 23 may be omitted.

The transmitting portion 24 is located in the distal end part of the vibrator 21 and provided to project from the vibrator 21. The distal end part of the transmitting portion 24 is in contact with the outer circumferential surface 111 of the rotor 110. Accordingly, the vibration of the vibrator 21 is transmitted to the rotor 110 via the transmitting portion 24. As described above, the driving device main body 2 is urged toward the outer circumferential surface 111 by the urging part 7, and thereby, the transmitting portion 24 is in contact with the rotor 110 with an appropriate frictional force. Therefore, slip may be suppressed and the vibration of the vibrator 21 may be efficiently transmitted to the rotor 110.

Note that the constituent material of the transmitting portion 24 is not particularly limited, but a hard material is preferable. The material includes e.g. various ceramics such as zirconia, alumina, and titania. Thereby, the transmitting portion 24 has higher durability and the deformation of the transmitting portion 24 is suppressed, and thus, the vibration of the vibrator 21 may be efficiently transmitted to the rotor 110.

As shown in FIG. 3, the vibrator 21, the supporting portion 22, and the connecting portion 23 are mainly formed by a pair of substrates 3, 4 (first substrates) placed to be opposed, and piezoelectric elements 5 and a spacer 6 located between the pair of substrates 3, 4. As shown in FIG. 2, the substrate 3 has a vibrating portion 31, a supporting portion 32 that supports the vibrating portion 31, and a pair of connecting portions 33 that connect the vibrating portion 31 and the supporting portion 32. Similarly, the substrate 4 has a vibrating portion 41, a supporting portion 42 that supports the vibrating portion 41, and a pair of connecting portions 43 that connect the vibrating portion 41 and the supporting portion 42.

The substrates 3, 4 have the same shape and size as each other, and the vibrating portions 31, 41 are placed to face with the piezoelectric elements 5 in between and the supporting portions 32, 42 are placed to face with the spacer 6 in between. The vibrator 21 is formed by a stacking structure of the vibrating portion 31, the piezoelectric elements 5, and the vibrating portion 41, the supporting portion 22 is formed by a stacking structure of the supporting portion 32, the spacer 6, and the supporting portion 42, and the connecting portion 23 is formed by the connecting portions 33, 43. As described above, the piezoelectric elements 5 and the spacer 6 are sandwiched by the substrates 3, 4, and thereby, the driving device main body 2 has the shape symmetric with respect to the thickness direction. Accordingly, the vibration of the driving device main body 2 in the out-of-plane direction may be suppressed and the vibration of the driving device main body 2 may be efficiently transmitted to the rotor 110.

In the embodiment, the substrates 3, 4 are formed by single-crystal silicon substrates using single-crystal silicon as a constituent material. Thereby, for example, the substrates 3, 4 may be formed with higher dimensional accuracy by etching or the like. The single-crystal silicon substrates are not particularly limited, but silicon (100) substrates, silicon (110) substrates, silicon (112) substrates, or the like may be used. Note that, as the substrates 3, 4, substrates having the same crystal orientation or different crystal orientations may be used.

The piezoelectric elements 5 are located between the vibrating portions 31, 41, and joined to the respective vibrating portions 31, 41 via insulating adhesives (not shown). Note that, as the insulating adhesives, adhesives in which ACP (anisotropic conductive particles) are dispersed may be used. Further, as shown in FIG. 2, the piezoelectric elements 5 have five piezoelectric elements 5A, 5B, 5C, 5D, 5E for driving and two piezoelectric elements 5F, 5G for detection. The piezoelectric element 5C is placed along the longitudinal direction of the vibrator 21 in the center part of the vibrator 21 in the width direction. With respect to the piezoelectric element 5C, the piezoelectric elements 5A, 5B are placed on one side of the vibrator 21 in the width direction side by side in the longitudinal direction of the vibrator 21 and the piezoelectric elements 5D, 5E are placed on the other side side by side in the longitudinal direction of the vibrator 21. Further, the piezoelectric element 5F is placed on the distal end side of the piezoelectric element 5C and the piezoelectric element 5G is placed on the proximal end side.

Each of the piezoelectric elements 5A, 5B, 5C, 5D, 5E, 5F, 5G has a configuration in which a piezoelectric material is sandwiched by a pair of electrodes. Each of the piezoelectric elements 5A, 5B, 5C, 5D, 5E for driving expands and contracts in directions along the longitudinal direction of the vibrator 21 when a voltage is applied between the pair of electrodes. On the other hand, each of the piezoelectric elements 5F, 5G for detection deforms and generates electric charge.

In the embodiment, a single piezoelectric material is used in common in the piezoelectric elements 5A, 5B, 5C, 5D, 5E, 5F, 5G. One of the electrodes is used in common in the seven piezoelectric elements 5A, 5B, 5C, 5D, 5E, 5F, 5G, and, for example, connected to GND. The other electrodes are individually formed in the seven piezoelectric elements 5A, 5B, 5C, 5D, 5E, 5F, 5G. Note that the configurations of the piezoelectric elements 5 are not limited to those, but, for example, the piezoelectric materials may be individually formed in the piezoelectric elements 5A, 5B, 5C, 5D, 5E, 5F, 5G. Or, for example, the piezoelectric element 5C may be omitted. Or, one or both of the piezoelectric elements 5F, 5G for detection may be omitted and the placements thereof are not particularly limited.

As the constituent material of the piezoelectric material, e.g. piezoelectric ceramics such as lead titanate zirconate (PZT), barium titanate, lead titanate, potassium niobate, lithium niobate, lithium tantalate, sodium tungstate, zin oxide, barium strontium titanate (BST), strontium bismuth tantalate (SBT), lead metaniobate, or lead scandium niobate may be used. The piezoelectric material formed using the piezoelectric ceramics may be formed from a bulk material or formed using the so-gel method or sputtering method, and may be preferably formed from the bulk material. Thereby, the manufacture of the piezoelectric elements 5 is easier. Note that, as the constituent material of the piezoelectric material, not only the above described piezoelectric ceramics but also polyvinylidene fluoride, quartz crystal, or the like may be formed.

The spacer 6 is located between the supporting portions 32, 42 and joined to the respective supporting portions 32, 42 via insulating adhesives (not shown). The thickness of the spacer 6 is nearly equal to the thickness of the piezoelectric elements 5. Thereby, deflection of the substrates 3, 4 in the out-of-plane direction may be suppressed. Note that the spacer 6 is not particularly limited, but e.g. various ceramics such as zirconia, alumina, and titania, various metal materials, silicon, various resin materials, etc. may be used. Of the materials, various ceramics, various metal materials, and silicon are preferably used, and thereby, the hard spacer 6 may be obtained.

The urging part 7 has a function of urging the driving device main body 2 toward the outer circumferential surface 111 of the rotor 110. As shown in FIG. 3, the urging part 7 has a pair of substrates 8, 9 (second substrates) that sandwich the driving device main body 2, and a spacer 10 sandwiched between the substrates 8, 9. The substrate 8 has a base portion 81, a fixing portion 82, and a spring portion 83 connecting the base portion 81 and the fixing portion 82. Similarly, the substrate 9 has a base portion 91, a fixing portion 92, and a spring portion 93 connecting the base portion 91 and the fixing portion 92.

These substrates 8, 9 have the same shape and size as each other, and the base portions 81, 91 are placed to face with the driving device main body 2 in between and the fixing portions 82, 92 are placed to face with the spacer 10 in between. The driving device main body 2 is joined to the base portions 81, 91 by e.g. joining members such as adhesives. The part in which the fixing portion 82, the spacer 10, and the fixing portion 92 are stacked is a part fixed to a stage or the like and through holes 71, 72 for passing screws used for fixation to the stage or the like are provided therein. In the configuration, the urging part 7 is fixed to the stage or the like with the spring portions 83, 93 deflected, and thereby, the driving device main body 2 may be urged toward the rotor 110. As described above, the driving device main body 2 is sandwiched by the substrates 8, 9, and thereby, the urging part 7 has a symmetric shape with respect to the thickness direction. For example, inclination of the driving device main body 2 in the out-of-plane direction or the like may be suppressed and the driving device main body 2 may be urged toward the rotor 110 in a stable position.

In the embodiment, the substrates 8, 9 are formed by single-crystal silicon substrates using single-crystal silicon as a constituent material. Thereby, for example, the substrates 8, 9 may be formed with higher dimensional accuracy by etching or the like. The single-crystal silicon substrates are not particularly limited, but silicon (100) substrates, silicon (110) substrates, silicon (112) substrates, or the like may be used. Note that, as the substrates 8, 9, substrates having the same crystal orientation or different crystal orientations may be used.

The spacer 10 is located between the fixing portions 82, 92 and joined to the respective fixing portions 82, 92 via insulating adhesives (not shown). The thickness of the spacer 10 is nearly equal to the thickness of the driving device main body 2. Thereby, deflection of the substrates 8, 9 in the out-of-plane direction may be suppressed. Note that the spacer 10 is not particularly limited, but e.g. various ceramics such as zirconia, alumina, and titania, various metal materials, silicon, various resin materials, etc. may be used. Of the materials, various ceramics, various metal materials, and silicon are preferably used, and thereby, the hard spacer 10 may be obtained.

As above, the piezoelectric motor 100 is briefly explained. Note that, in the embodiment, the configuration in which the piezoelectric driving device 1 has the single driving device main body 2 is explained, however, the configuration is not limited to that. For example, a configuration in which a plurality of driving device main bodies 2 are stacked as shown in FIG. 4 may be employed.

Next, a driving method of the piezoelectric motor 100 will be explained. For example, a drive signal V1 (voltage) shown in FIG. 5 is applied to the piezoelectric elements 5A, 5E, a drive signal V2 is applied to the piezoelectric element 5C, and a drive signal V3 is applied to the piezoelectric elements 5B, 5D. Thereby, as shown in FIG. 6, the vibrator 21 expands and contracts in the longitudinal directions and bends in the width directions, and thereby, flexurally vibrates in an S-shape. With the vibration, the transmitting portion 24 makes an elliptic motion in the counterclockwise direction in the drawing. By the elliptic motion of the transmitting portion 24, the rotor 110 is pushed out and the rotor 110 rotates clockwise.

On the other hand, a drive signal V1' in FIG. 7 is applied to the piezoelectric elements 5A, 5E, a drive signal V2' is applied to the piezoelectric element 5C, and a drive signal V3' is applied to the piezoelectric elements 5B, 5D. Thereby, as shown in FIG. 8, the vibrator 21 expands and contracts in the longitudinal directions and bends in the width directions, and thereby, flexurally vibrates in an inverted S-shape to that in FIG. 6. With the vibration, the transmitting portion 24 makes an elliptic motion in the clockwise direction in the drawing. By the elliptic motion of the transmitting portion 24, the rotor 110 is pushed out and the rotor 110 rotates counterclockwise.

As long as the transmitting portion 24 may make the elliptic motion in the clockwise direction or counterclockwise direction, the patterns of the drive signals applied to the driving device main body 2 are not particularly limited. Note that, hereinafter, for convenience of explanation, the drive signals V1, V2, V3 (drive signals V1', V2', V3') are collectively referred to as "drive signal Sd".

When the vibrator 21 vibrates in the above described manner, the piezoelectric elements 5F, 5G bend, and electric charge generated from a piezoelectric material 51 by the bending is output from the piezoelectric elements 5F, 5G as a detection signal Ss (see FIGS. 5 and 7). Then, driving of the driving device main body 2 is feedback-controlled based on the detection signal Ss. The control method is not particularly limited, but e.g. a method of changing the frequency of the drive signal Sd as needed to track the maximum value of the amplitude of the detection signal Ss may be employed. The amplitude of the detection signal Ss is proportional to the amplitude of the vibrator 21, and thus, the rotor 110 may be rotated faster by setting of the amplitude of the detection signal Ss to the maximum value. Or, as another control method, e.g. a method of changing the frequency of the drive signal Sd as needed for the phase difference between the drive signal Sd and the detection signal Ss to track a predetermined value may be employed. There is a correlation between the amplitude of the vibrator 21 and the phase difference, and thus, the rotor 110 may be rotated faster by adjustment of the phase difference to the value at which the amplitude of the vibrator 21 is the maximum.

In the piezoelectric driving device 1, as described above, the driving device main body 2 is urged toward the outer circumferential surface 111 of the rotor 110 by the urging part 7. That is, the transmitting portion 24 is pressed against the outer circumferential surface 111. Accordingly, as shown in FIG. 1, a shear force (stress) is applied to the piezoelectric driving device 1 in a direction B opposite to an urging direction A. Note that the direction B here refers to a direction of a shear force applied when the driving device main body 2 is not driven (at rest without flexural vibration). Here, the substrates 3, 4 used for the driving device main body 2 are respectively formed using the single-crystal silicon substrates, and the crystal material like the silicon single crystal as the main material has cleavability (a tendency of a silicon crystal to break or split along a cleavage face or plane). Accordingly, if the shear force direction B coincides with a cleavage direction C (a direction in which the silicon crystal is broken or split along the cleavage face or plane with respect to a reference surface) of the silicon substrates, the substrates 3, 4 are easily cleaved (broken) and mechanical strength of the driving device main body 2 is significantly reduced. Note that it is known that the cleavage face of the silicon single crystal is {111} face and the above described "cleavage direction C" refers to a direction of a line in which the principal surfaces of the substrates 3, 4 and the {111} face cross.

Therefore, in the embodiment, as shown in FIG. 9, the substrate 3 is formed so that the cleavage direction C may not coincide with the shear force direction B, that is, the cleavage direction C may cross the shear force direction B in the plan view. Similarly, the substrate 4 is formed so that the cleavage direction C may not coincide with the shear force direction B, that is, the cleavage direction C may cross the shear force direction B in the plan view. Thereby, the substrates 3, 4 are respectively harder to be cleaved (broken) and the driving device main body 2 having high mechanical strength is obtained. Note that there are two cleavage directions C (C1, C2) for each of the substrates 3, 4, and the respective cleavage directions C1, C2 do not coincide with the shear force direction B.

It is only necessary that the substrate 3 is formed so that the cleavage directions C1, C2 may not coincide with the shear force direction B in the plan view, and both an angle θ2 formed by the cleavage direction C1 and the shear force direction B and an angle θ3 formed by the cleavage direction C2 and the shear force direction B are preferably equal to or larger than 20°, and more preferably equal to or larger than 30°. Similarly, it is only necessary that the substrate 4 is formed so that the cleavage directions C1, C2 may not coincide with the shear force direction B in the plan view, and both the angle θ2 formed by the cleavage direction C1 and the shear force direction B and the angle θ3 formed by the cleavage direction C2 and the shear force direction B are preferably equal to or larger than 20°, and more preferably equal to or larger than 30°. Thereby, the substrates 3, 4 are respectively even harder to be cleaved (broken) and the driving device main body 2 having higher mechanical strength is obtained. Further, for example, during driving of the driving device main body 2, the shear force direction B changes with the flexural vibration of the driving device main body 2. Accordingly, as described above, both θ2, θ3 are set to be equal to or larger than 20° and further set to be equal to or larger than 30°, and thereby, even if the direction B tilts during driving, coincidence of the direction B with the cleavage directions C1, C2 may be effectively suppressed.

Note that, in the embodiment, in the substrate 3, the shear force direction B is located within the angle θ1 formed by the cleavage directions C1, C2, however, not limited to that. For example, the shear force direction B may be located beyond the angle θ1 formed by the cleavage directions C1, C2 of the substrate 3. The same applies to the substrate 4. Further, in the embodiment, the cleavage directions C1, C2 of the substrate 3 and the cleavage directions C1, C2 of the substrate 4 coincide, however, are not limited to that. The cleavage directions C1, C2 of the substrate 3 and the cleavage directions C1, C2 of the substrate 4 may be different.

In the embodiment, as shown in FIG. 10, oxide films 39 (silicon oxide films) formed by thermal oxidation are placed on the surfaces (both principal surfaces) of the substrate 3. As described above, the oxide films 39 are formed on the surfaces of the substrate 3, and thereby, regularity of the crystal in the surfaces of the substrate 3 is reduced (amorphized) and the substrate 3 is even harder to be cleaved. Similarly, oxide films 49 (silicon oxide films) formed by thermal oxidation are placed on the surfaces (both principal surfaces) of the substrate 4. As described above, the oxide films 49 are formed on the surfaces of the substrate 4, and thereby, regularity of the crystal in the surfaces of the substrate 4 is broken and the substrate 4 is even harder to be cleaved. The thicknesses of the oxide films 39, 49 are not particularly limited, but may be e.g. from 1 µm to 2.5 µm. The films having the thicknesses may be easily formed by the thermal oxidation method, and the above described effects may be exerted more reliably. Note that it is only necessary that the oxide films 39 are placed on at least part of the substrate 3. In this case, shear forces are easily applied to the vibrating portion 31 and the connecting portion 33, and thus, it is preferable that the oxide films 39 are preferentially placed in the locations. The same applies to the oxide films 49 placed on the substrate 4. Or, the oxide films 39, 49 may be omitted.

As above, the driving device main body 2 is explained. Like the driving device main body 2, the substrates 8, 9 formed using the single crystal silicon (crystal material) substrates are used for the urging part 7. Accordingly, as shown in FIG. 11, the substrates 8, 9 are formed so that the cleavage direction C (a direction in which the silicon crystal is broken or split along the cleavage face or plane with respect to a reference surface) may not coincide with the shear force direction B. Specifically, the substrate 8 is formed so that the cleavage directions C (C3, C4) may not coincide with the shear force direction B, that is, the cleavage directions C (C3, C4) may cross the shear force direction B in the plan view. Similarly, the substrate 9 is formed so that the cleavage directions C (C3, C4) may not coincide with the shear force direction B, that is, the cleavage directions C (C3, C4) may cross the shear force direction B in the plan view. Thereby, the substrates 8, 9 are respectively harder to be cleaved (broken) and the driving device main body 2 having high mechanical strength is obtained.

It is only necessary that the substrate 8 is formed so that the cleavage directions C3, C4 do not coincide with the shear force direction B in the plan view, and both an angle θ5 formed by the cleavage direction C3 and the shear force direction B and an angle θ6 formed by the cleavage direction C4 and the shear force direction B are preferably equal to or larger than 20°, and more preferably equal to or larger than 30°. Similarly, it is only necessary that the substrate 9 is formed so that the cleavage directions C3, C4 do not coincide with the shear force direction B in the plan view, and both the angle θ5 formed by the cleavage direction C3 and the shear force direction B and the angle θ6 formed by the cleavage direction C4 and the shear force direction B are preferably equal to or larger than 20°, and more preferably equal to or larger than 30°. Thereby, the substrates 8, 9 are respectively even harder to be cleaved (broken) and the urging part 7 having higher mechanical strength is obtained. Further, for example, during driving of the driving device main body 2, the shear force direction B changes with the flexural vibration of the driving device main body 2. Accordingly, as described above, both θ5, θ6 are set to be equal to or larger than 20° and further set to be equal to or larger than 30°, and thereby, even if the direction B tilts during driving, coincidence of the direction B with the cleavage directions C3, C4 may be effectively suppressed.

Note that, in the embodiment, in the substrate 8, the shear force direction B is located beyond the angle θ4 formed by the cleavage directions C3, C4, however, not limited to that. For example, the shear force direction B may be located within the angle θ4 formed by the cleavage directions C3, C4 of the substrate 3. The same applies to the substrate 9. Further, in the embodiment, the cleavage directions C3, C4 of the substrate 8 and the cleavage directions C3, C4 of the substrate 9 coincide, however, are not limited to that. The cleavage directions C3, C4 of the substrate 8 and the cleavage directions C3, C4 of the substrate 9 may be different. Further, in the embodiment, the cleavage directions C3, C4 of the substrates 8, 9 and the cleavage directions C1, C2 of the substrates 3, 4 are different, however, not limited to that. The cleavage directions C3, C4 of the substrates 8, 9 and the cleavage directions C1, C2 of the substrates 3, 4 may coincide.

In the embodiment, as shown in FIG. 12, oxide films 89 (silicon oxide films) formed by thermal oxidation are placed on the surfaces (both principal surfaces) of the substrate 8. As described above, the oxide films 89 are formed on the surfaces of the substrate 8, and thereby, regularity of the crystal in the surfaces of the substrate 8 is broken and the substrate 8 is even harder to be cleaved. Similarly, oxide films 99 (silicon oxide films) formed by thermal oxidation are placed on the surfaces (both principal surfaces) of the substrate 9. As described above, the oxide films 99 are formed on the surfaces of the substrate 9, and thereby, regularity of the crystal in the surfaces of the substrate 9 is broken and the substrate 9 is even harder to be cleaved. The thicknesses of the oxide films 89, 89 are not particularly limited, but may be e.g. from 1 μm to 2.5 μm. The films having the thicknesses may be easily formed by the thermal oxidation method, and the above described effects may be exerted more reliably. Note that it is only necessary that the oxide films 89 are placed on at least part of the substrate 8. In this case, a shear force is easily applied to the spring portion 83, and thus, it is preferable that the oxide films 89 are preferentially placed in the locations. The same applies to the oxide films 99 placed on the substrate 9. Or, the oxide films 89, 99 may be omitted.

As above, the piezoelectric motor 100 and the piezoelectric driving device 1 of the embodiment are explained. As described above, the piezoelectric driving device 1 has the substrate 3 (first substrate) with cleavability and the piezoelectric elements 5 placed on the substrate 3, and the cleavage directions C of the substrate 3 and the direction B in which the shear force is applied do not coincide in the plan view of the substrate 3. Similarly, the piezoelectric driving device 1 has the substrate 4 (first substrate) with cleavability and the piezoelectric elements 5 placed on the substrate 4, and the cleavage directions C of the substrate 4 and the direction B in which the shear force is applied do not coincide in the plan view of the substrate 4. Thereby, the substrates 3, 4 are respectively harder to be cleaved (broken) and the piezoelectric driving device 1 having high mechanical strength is obtained.

Further, as described above, it is preferable that the angles formed by the cleavage directions C of the substrate 3 and the direction B in which the shear force is applied are equal to or larger than 20° in the plan view of the substrate 3. Similarly, it is preferable that the angles formed by the cleavage directions C of the substrate 4 and the direction B in which the shear force is applied are equal to or larger than 20° in the plan view of the substrate 4. Thereby, the substrates 3, 4 are respectively even harder to be cleaved (broken) and the piezoelectric driving device 1 having higher mechanical strength is obtained. For example, during driving of the piezoelectric driving device 1, the shear force direction B changes with the flexural vibration of the vibrator 21. Accordingly, as described above, θ are set to be equal to or larger than 20°, and thereby, even if the direction B tilts during driving, coincidence of the direction B with the cleavage directions C may be effectively suppressed.

As descried above, the substrates 3, 4 are formed from silicon single-crystal substrates. That is, the substrates 3, 4 contain silicon single crystal. Thereby, for example, the substrates 3, 4 may be formed with higher dimensional accuracy by etching or the like. Note that the the substrates 3, 4 are not respectively limited to the silicon single-crystal substrates, but may be single-crystal substrates formed using e.g. germanium, gallium arsenide, gallium arsenide phosphide, gallium nitride, silicon carbide, or the like. The substrates have cleavability and may exert the same effects.

As described above, the substrate 3 has the vibrating portion 31 on which the piezoelectric elements 5 are placed, the supporting portion 32 that supports the vibrating portion 31, and the connecting portion 33 that connects the vibrating portion 31 and the supporting portion 32. Similarly, the substrate 4 has the vibrating portion 41 on which the piezoelectric elements 5 are placed, the supporting portion 42 that supports the vibrating portion 41, and the connecting portion 43 that connects the vibrating portion 41 and the supporting portion 42. According to the configuration, the vibrating portions 31, 41 may be efficiently flexurally vibrated.

As described above, in the piezoelectric driving device 1, the pair of substrates 3, 4 are provided with the piezoelectric elements 5 in between. Thereby, the piezoelectric driving device 1 has the symmetrical shape with respect to the thickness direction, and the vibration of the piezoelectric driving device 1 in the out-of-plane direction may be suppressed and the vibration of the piezoelectric driving device 1 may be efficiently transmitted to the rotor 110. Note that the piezoelectric driving device 1 is not limited to that, but e.g. one of the substrates 3, 4 may be omitted.

As described above, in the piezoelectric driving device 1, the oxide films 39 are formed on at least part of the surfaces of the substrate 3. Similarly, in the piezoelectric driving device 1, the oxide films 49 are formed on at least part of the surfaces of the substrate 4. Thereby, regularity of the crystal in the surfaces of the substrates 3, 4 is broken and the substrates 3, 4 are even harder to be cleaved.

As described above, the piezoelectric driving device 1 has the urging part 7 that urges the substrates 3, 4 toward the rotor 110 (object). Further, the urging part 7 has the substrates 8, 9 (second substrates) having cleavability and supporting the substrates 3, 4. In the plan view of the substrate 8, the cleavage directions C of the substrate 8 and the direction B in which the shear force is applied do not coincide. Similarly, in the plan view of the substrate 9, the cleavage directions C of the substrate 9 and the direction B in which the shear force is applied do not coincide. Thereby, the substrates 8, 9 are respectively harder to be cleaved (broken) and the piezoelectric driving device 1 having high mechanical strength is obtained.

Further, as described above, it is preferable that the angles formed by the cleavage directions C of the substrate 8 and the direction B in which the shear force is applied are equal to or larger than 20° in the plan view of the substrate 8. Similarly, it is preferable that the angles formed by the cleavage directions C of the substrate 9 and the direction B in which the shear force is applied are equal to or larger than 20° in the plan view of the substrate 9. Thereby, the substrates 8, 9 are respectively even harder to be cleaved (broken) and the piezoelectric driving device 1 having higher mechanical strength is obtained. For example, during driving of the piezoelectric driving device 1, the shear force direction B changes with the flexural vibration of the vibrator 21. Accordingly, as described above, θ are set to be equal to or larger than 20°, and thereby, even if the direction B changes during driving, coincidence of the direction B with the cleavage directions C may be effectively suppressed.

As descried above, the substrates 8, 9 are formed from silicon single-crystal substrates. That is, the substrates 8, 9 contain silicon single crystal. Thereby, for example, the substrates 8, 9 may be formed with higher dimensional accuracy by etching or the like. Note that the the substrates 8, 9 are not respectively limited to the silicon single-crystal substrates, but may be single-crystal substrates formed using e.g. germanium, gallium arsenide, gallium arsenide phosphide, gallium nitride, silicon carbide, or the like. The substrates have cleavability and may exert the same effects.

As described above, the substrate 8 has the base portion 81 to which the substrate 3 is fixed and the spring portion 83 connected to the base portion 81. Similarly, the substrate 9 has the base portion 91 to which the substrate 4 is fixed and the spring portion 93 connected to the base portion 91. According to the configuration, for example, the spring portions 83, 93 are bent and fixed, and thereby, the driving device main body 2 may be easily urged.

As described above, in the piezoelectric driving device 1, the pair of substrates 8, 9 are provided with the piezoelectric elements 5 in between. Thereby, the urging part 7 has the symmetrical shape with respect to the thickness direction, and the inclination of the driving device main body 2 in the out-of-plane direction or the like may be suppressed and the driving device main body 2 may be urged toward the rotor 110 in the stable position. Note that the piezoelectric driving device 1 is not limited to that, but e.g. one of the substrates 8, 9 may be omitted.

As described above, in the piezoelectric driving device 1, the oxide films 89 are formed on at least part of the surfaces of the substrate 8. Similarly, in the piezoelectric driving device 1, the oxide films 99 are formed on at least part of the surfaces of the substrate 9. Thereby, regularity of the crystal in the surfaces of the substrates 8, 9 is broken and the substrates 8, 9 are even harder to be cleaved.

As described above, the piezoelectric motor 100 has the piezoelectric driving device 1 and the rotor 110 (driven part) in contact with the piezoelectric driving device 1. Accordingly, the piezoelectric motor 100 may enjoy the benefit of the piezoelectric driving device 1 and exert higher reliability.

Second Embodiment

Next, a robot according to the second embodiment of the invention will be explained.

Figure 13:
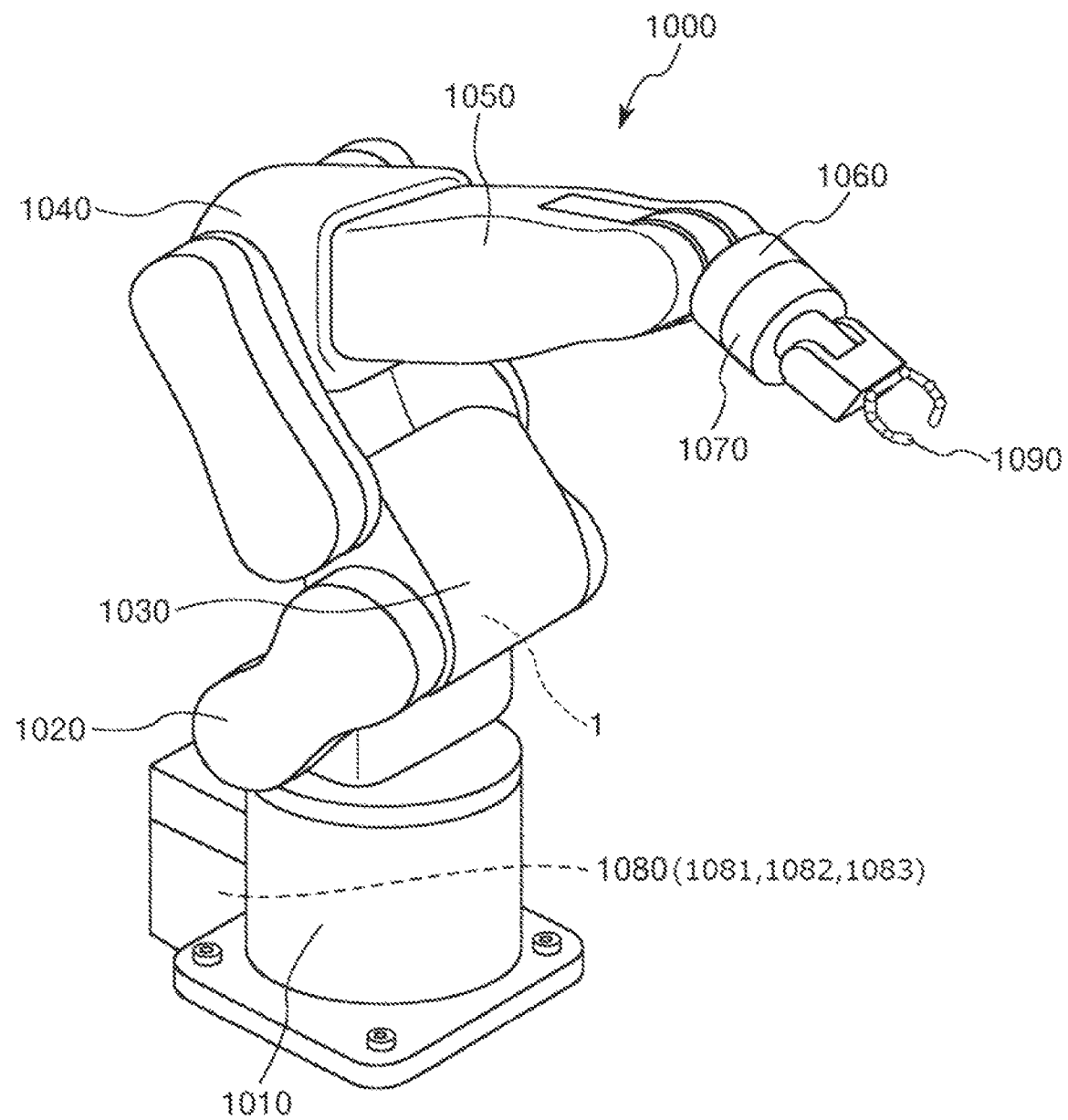
FIG. 13 is a perspective view showing a robot according to the second embodiment of the invention.

FIG. 13 is a perspective view showing the robot according to the second embodiment of the invention.

A robot 1000 shown in FIG. 13 may perform work of feeding, removing, carrying, assembly, etc. of precision apparatuses and components forming the apparatuses. The robot 1000 is a six-axis robot, and has a base 1010 fixed to a floor or ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a control apparatus 1080 that controls driving of these arms 1020, 1030, 1040, 1050, 1060, 1070.

In the arm 1070, a hand connecting part is provided, and an end effector 1090 according to work to be executed by the robot 1000 is attached to the hand connecting part. The piezoelectric driving devices 1 are mounted on all or part of respective joint parts and the respective arms 1020, 1030, 1040, 1050, 1060, 1070 are rotated by driving of the piezoelectric driving devices 1. Note that the piezoelectric driving device 1 may be mounted on the end effector 1090 and used for driving of the end effector 1090.

The control apparatus 1080 is formed by a computer and has e.g. a processor 1081 (CPU), a memory 1082, an I/F 1083 (interface), etc. The processor 1081 executes a predetermined program (code string) stored in the memory 1082, and thereby, controls driving of the respective parts (particularly, the piezoelectric driving devices 1) of the robot 1000. Note that the program may be downloaded from an external server via the I/F 1083. Or, all or part of the configuration of the control apparatus 1080 may be a configuration provided outside of the robot 1000 and connected via a communication network such as LAN (local area network).

The robot 1000 includes the piezoelectric driving device 1. Accordingly, the robot 1000 may enjoy the benefit of the above described piezoelectric driving device 1 and exert higher reliability.

Third Embodiment

Next, an electronic component conveyance apparatus according to the third embodiment of the invention will be explained.

Figure 14:
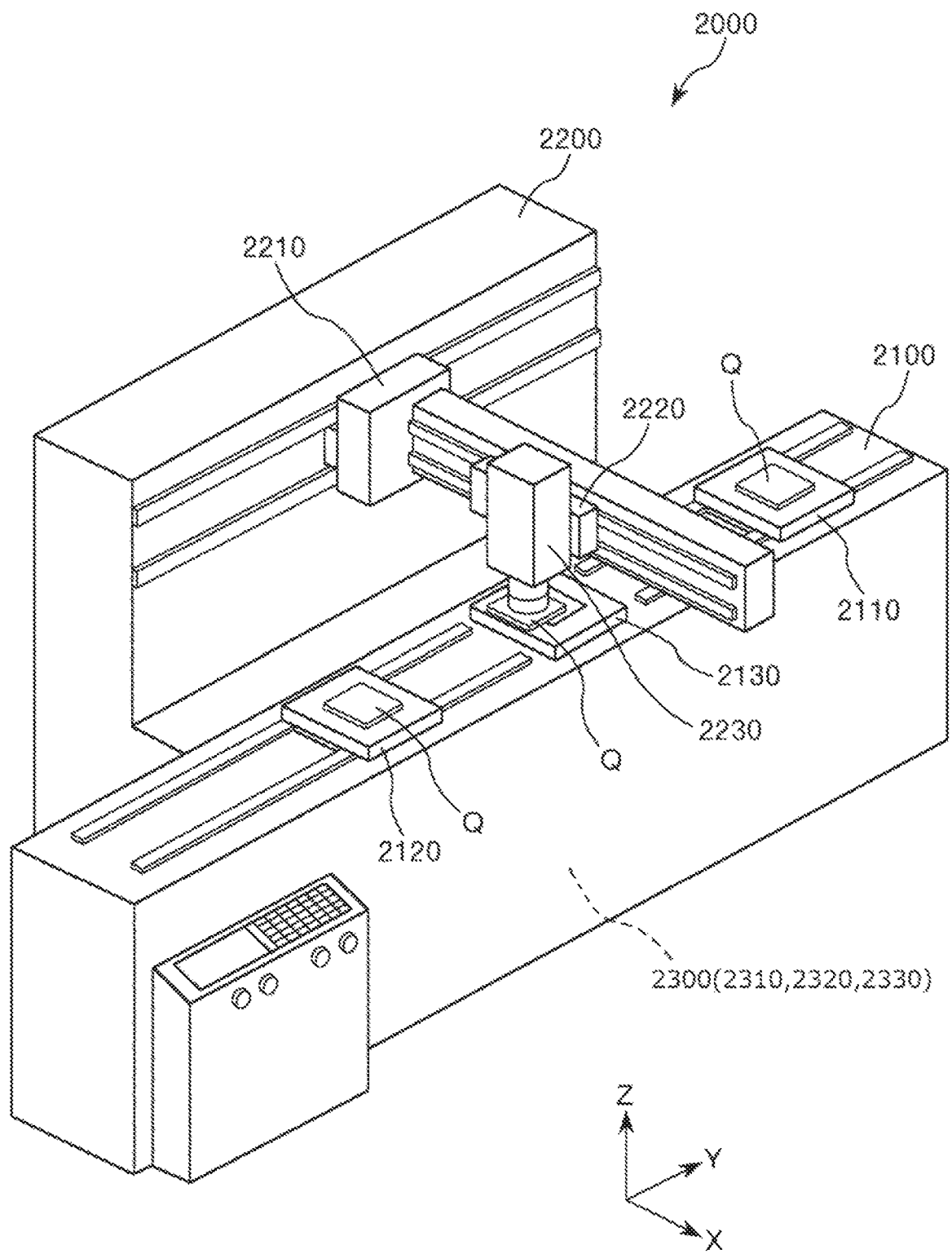
FIG. 14 is a perspective view showing an electronic component conveyance apparatus according to the third embodiment of the invention.
Figure 15:
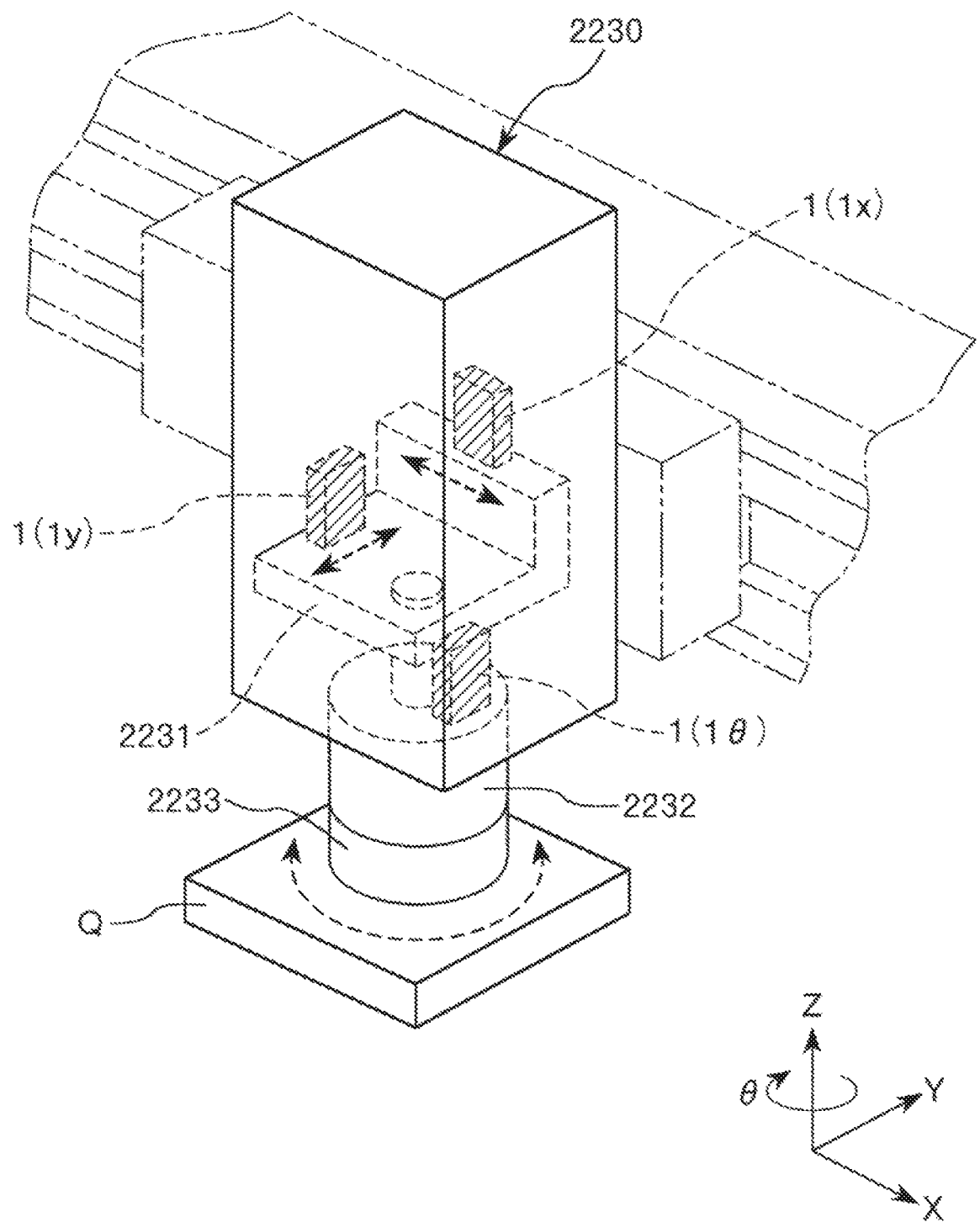
FIG. 15 is a perspective view showing an electronic component holding unit of the electronic component conveyance apparatus shown in FIG. 14.

FIG. 14 is a perspective view showing the electronic component conveyance apparatus according to the third embodiment of the invention. FIG. 15 is a perspective view showing an electronic component holding unit of the electronic component conveyance apparatus shown in FIG. 14. Hereinafter, for convenience of explanation, three axes orthogonal to one another are referred to as "X-axis", "Y-axis", and "Z-axis".

An electronic component conveyance apparatus 2000 shown in FIG. 14 is applied to an electronic component inspection apparatus, and has a base 2100, a support 2200 provided on the side of the base 2100, and a control apparatus 2300 that controls driving of the respective parts. Further, on the base 2100, an upstream stage 2110 on which an electronic component Q to be inspected is mounted and conveyed in the Y-axis directions, a downstream stage 2120 on which an electronic component Q that has been inspected is mounted and conveyed in the Y-axis directions, and an inspection table 2130 located between the upstream stage 2110 and the downstream stage 2120 for inspection of electrical characteristics of the electronic component Q are provided. Note that examples of the electronic components Q include e.g. semiconductors, semiconductor wafers, display devices such as CLD and OLED, quartz crystal devices, various sensors, inkjet heads, various MEMS devices, etc.

Further, a Y-stage 2210 movable in the Y-axis directions with respect to the support 2200 is provided on the support 2200, an X-stage 2220 movable in the X-axis directions with respect to the Y-stage 2210 is provided on the Y-stage 2210, and an electronic component holding unit 2230 movable in the Z-axis directions with respect to the X-stage 2220 is provided on the X-stage 2220.

As shown in FIG. 15, the electronic component holding unit 2230 has a fine adjustment plate 2231 movable in the X-axis directions and the Y-axis directions, a rotating part 2232 rotatable about the Z-axis with respect to the fine adjustment plate 2231, a holding part 2233 provided on the rotating part 2232 and holding the electronic component Q. The electronic component holding unit 2230 contains a piezoelectric driving device 1 (1x) for moving the fine adjustment plate 2231 in the X-axis directions, a piezoelectric driving device 1 (1y) for moving the fine adjustment plate 2231 in the Y-axis directions, and a piezoelectric driving device 1 (1θ) for rotating the rotating part 2232 about the Z-axis.

The control apparatus 2300 is formed by a computer and has e.g. a processor 2310 (CPU), a memory 2320, an I/F 2330 (interface), etc. The processor 2310 executes a predetermined program (code string) stored in the memory 2320, and thereby, controls driving of the respective parts (particularly, the piezoelectric driving devices 1) of the electronic component conveyance apparatus 2000. Note that the program may be downloaded from an external server via the I/F 2330. Or, all or part of the configuration of the control apparatus 2300 may be a configuration provided outside of the electronic component conveyance apparatus 2000 and connected via a communication network such as LAN (local area network).

The electronic component conveyance apparatus 2000 includes the piezoelectric driving device 1. Accordingly, the electronic component conveyance apparatus 2000 may enjoy the benefit of the above described piezoelectric driving device 1 and exert higher reliability.

Fourth Embodiment

Next, a printer according to the fourth embodiment of the invention will be explained.

Figure 16:
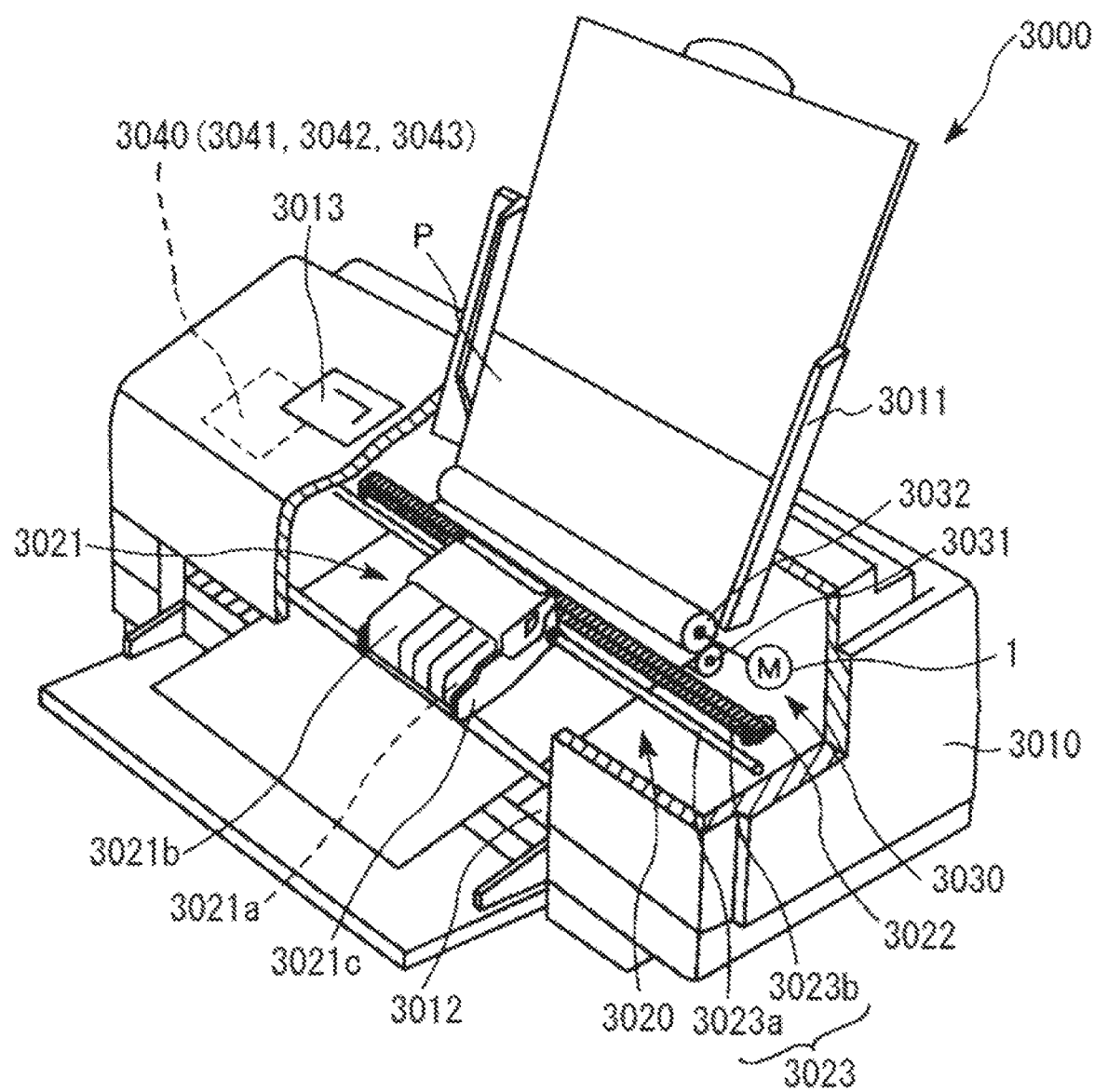
FIG. 16 is a schematic diagram showing an overall configuration of a printer according to the fourth embodiment of the invention.

FIG. 16 is a schematic diagram showing an overall configuration of the printer according to the fourth embodiment of the invention.

A printer 3000 shown in FIG. 16 includes an apparatus main body 3010, a printing mechanism 3020 provided inside of the apparatus main body 3010, a paper feed mechanism 3030, and a control apparatus 3040. Further, in the apparatus main body 3010, a tray 3011 in which recording paper P is placed, a paper eject opening 3012 through which the recording paper P is ejected, and an operation panel 3013 of a liquid crystal display or the like are provided.

The printing mechanism 3020 includes a head unit 3021, a carriage motor 3022, and a reciprocation mechanism 3023 that reciprocates the head unit 3021 by drive power of the carriage motor 3022. The head unit 3021 has a head 3021a as an inkjet recording head, an ink cartridge 3021b that supplies ink to the head 3021a, and a carriage 3021c on which the head 3021a and the ink cartridge 3021b are mounted.

The reciprocation mechanism 3023 has a carriage guide shaft 3023a that reciprocably supports the carriage 3021c and a timing belt 3023b that moves the carriage 3021c on the carriage guide shaft 3024a by the drive power of the carriage motor 3022. The paper feed mechanism 3030 has a driven roller 3031 and a driving roller 3032 in press contact with each other, and the piezoelectric driving device 1 that drives the driving roller 3032.

In the printer 3000, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

The control apparatus 3040 is formed by a computer and has e.g. a processor 3041 (CPU), a memory 3042, an I/F 3043 (interface), etc. The processor 3041 executes a predetermined program (code string) stored in the memory 3042, and thereby, controls driving of the respective parts (particularly, the piezoelectric driving devices 1) of the printer 3000. For example, the control is executed based on print data input from a host computer such as a personal computer via the I/F 3043. Note that the program may be downloaded from an external server via the I/F 3043. Or, all or part of the configuration of the control apparatus 3040 may be a configuration provided outside of the printer 3000 and connected via a communication network such as LAN (local area network).

The printer 3000 includes the piezoelectric driving device 1. Accordingly, the printer 3000 may enjoy the benefit of the above described piezoelectric driving device 1 and exert higher reliability. Note that, in the embodiment, the piezoelectric driving device 1 drives the driving roller 3032 for paper feed, and additionally, may drive e.g. the carriage 3021c.

Fifth Embodiment

Next, a projector according to the fifth embodiment of the invention will be explained.

Figure 17:
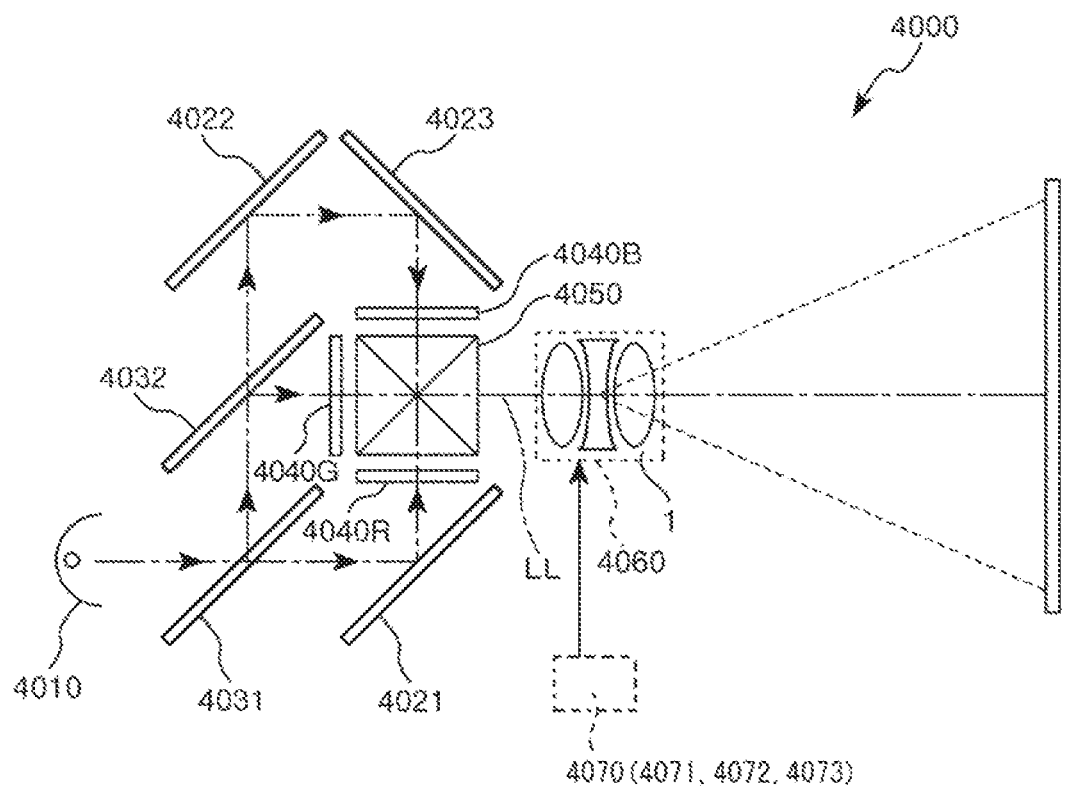
FIG. 17 is a schematic diagram showing an overall configuration of a projector according to the fifth embodiment of the invention.

FIG. 17 is a schematic diagram showing an overall configuration of the projector according to the fifth embodiment of the invention.

A projector 4000 shown in FIG. 17 is an LCD projector, and includes a light source 4010, mirrors 4021, 4022, 4023, dichroic mirrors 4031, 4032, liquid crystal display devices 4040R, 4040G, 4040B, a dichroic prism 4050, a projection lens system 4060, and a control apparatus 4070.

The light source 4010 includes e.g. a halogen lamp, mercury lamp, and light emitting diode (LED). Further, alight source that outputs white light is used as the light source 4010. First, the light output from the light source 4010 is separated by the dichroic mirror 4031 into red light (R) and other light. The red light is reflected by the mirror 4021, then, enters the liquid crystal display device 4040R, and the other light is further separated by the dichroic mirror 4032 into green light (G) and blue light (B). Then, the green light enters the liquid crystal display device 4040G, and the blue light is reflected by the mirrors 4022, 4023, then, enters the liquid crystal display device 4040B.

The liquid crystal display devices 4040R, 4040G, 4040B are respectively used as spatial light modulators. These liquid crystal display devices 4040R, 4040G, 4040B are transmissive spatial light modulators corresponding to primary colors of R, G, B, respectively, and include pixels arranged in a matrix having e.g. longitudinal 1080 rows and lateral 1920 columns. In the respective pixels, amounts of transmitted lights to incident lights are adjusted, and the light amount distributions in the all pixels are cooperatively controlled in the respective liquid crystal display devices 4040R, 4040G, 4040B. The lights respectively spatially modulated by the respective liquid crystal display devices 4040R, 4040G, 4040B are combined by the dichroic prism 4050, and a full-color picture light LL is output from the dichroic prism 4050. Then, the output picture light LL is enlarged by the projection lens system 4060 and projected on e.g. a screen or the like. Note that, in the projector 4000, the piezoelectric driving device 1 is used for moving at least one lens contained in the projection lens system 4060 in the optical axis direction and changing the focal length.

The control apparatus 4070 is formed by a computer and has e.g. a processor 4071 (CPU), a memory 4072, an I/F 4073 (interface), etc. The processor 4071 executes a predetermined program (code string) stored in the memory 4072, and thereby, controls driving of the respective parts (particularly, the piezoelectric driving device 1) of the projector 4000. Note that the program may be downloaded from an external server via the I/F 4073. Or, all or part of the configuration of the control apparatus 4070 may be a configuration provided outside of the projector 4000 and connected via a communication network such as LAN (local area network).

The projector 4000 includes the piezoelectric driving device 1. Accordingly, the projector 4000 may enjoy the benefit of the above described piezoelectric driving device 1 and exert higher reliability.

As above, the piezoelectric driving device, the piezoelectric motor, the robot, the electronic component conveyance apparatus, the printer, and the projector according to the invention are explained based on the illustrated embodiments, however, the invention is not limited to those. The configurations of the respective parts may be replaced by arbitrary configurations having the same functions. Further, other arbitrary configurations may be added to the invention. Furthermore, the respective embodiments may be combined as appropriate.

In the above described embodiment, the configurations in which the piezoelectric driving device is applied to the piezoelectric motor, robot, electronic component conveyance apparatus, printer, and projector are explained, however, the piezoelectric driving device may be applied to other various electronic devices.

The entire disclosure of Japanese Patent Application No. 2017-221561, filed Nov. 17, 2017 is expressly incorporated by reference herein.

What is claimed is:

1. A piezoelectric driving device comprising:
    three axes orthogonal to each other being defined as an X axis, a Y axis, and a Z axis;
    a first substrate having a first principal surface, the first principal surface extending along an X-Y plane along the X axis and the Y axis, the first substrate having a thickness along the Z axis, the first substrate having a first cleavage face along which the first substrate is broken when a force is applied to the first substrate, a broken surface of the first substrate being smooth and extending along the first cleavage face; and
    a piezoelectric element placed above the first substrate, the piezoelectric element being configured to deform so as to drive an object,
    wherein a cleavage direction of the first substrate is a crossing direction along which the first principal surface of the first substrate and the first cleavage face of the first substrate crosses,
    a direction in which a shear force is applied to the first substrate with respect to the first principal surface when the piezoelectric element moves is defined as a first shear force direction, and
    the cleavage direction of the first substrate and the first shear force direction do not coincide on the first principal surface of the first substrate.

2. The piezoelectric driving device according to claim 1, wherein an angle formed by the cleavage direction of the first substrate and the shear force direction on the first principal surface of the first substrate is equal to or larger than 20°.

3. The piezoelectric driving device according to claim 1, wherein the first substrate contains silicon single crystal.

4. The piezoelectric driving device according to claim 1, wherein the first substrate has:
    a vibrating portion above which the piezoelectric element is placed;
    a supporting portion that supports the vibrating portion; and
    a connecting portion that connects the vibrating portion and the supporting portion.

5. The piezoelectric driving device according to claim 1, wherein a pair of the first substrates are provided with the piezoelectric element in between.

6. The piezoelectric driving device according to claim 1, wherein an oxide film is formed on at least a part of a surface of the first substrate.

7. The piezoelectric driving device according to claim 1, further comprising an urging part that urges the first substrate toward the object,
    wherein the urging part has a second substrate that supports the first substrate, the second substrate has a second principal surface, the second principal surface extends along the X-Y plane, and the second substrate has a thickness along the Z axis,
    the second substrate has a second cleavage face along which the second substrate is broken when a force is applied to the second substrate, and a broken surface of the second substrate is smooth and extends along the second cleavage face,
    a cleavage direction of the second substrate is a crossing direction along which the principal surface of the first substrate and the cleavage face of the first substrate crosses,
    a direction in which the shear force is applied to the second substrate with respect to the second principal surface when the piezoelectric element moves is defined as a second shear force direction, and
    the cleavage direction of the second substrate and the second shear force direction do not coincide on the second principal surface of the second substrate.

8. The piezoelectric driving device according to claim 7, wherein an angle formed by the cleavage direction of the second substrate and the second shear direction on the second principal surface of the second substrate is equal to or larger than 20°.

9. The piezoelectric driving device according to claim 7, wherein the second substrate contains silicon single crystal.

10. The piezoelectric driving device according to claim 7, wherein the second substrate has:
 a base portion to which the first substrate is fixed; and
 a spring portion connected to the base portion.

11. The piezoelectric driving device according to claim 7, wherein a pair of the second substrates are provided with the piezoelectric element in between.

12. The piezoelectric driving device according to claim 7, wherein an oxide film is formed on at least a part of a surface of the second substrate.

13. An electronic component conveyance apparatus comprising:
 a base on which an electronic component is transported; and
 an holder holding the electronic component, the holder including the piezoelectric driving device according to claim 1, the holder moving the electronic component along the X axis and the Y axis.

14. The electronic component conveyance apparatus according to claim 13,
 wherein an angle formed by the cleavage direction of the first substrate and the shear force direction on the first principal surface of the first substrate is equal to or larger than 20°.

15. A printer comprising the piezoelectric driving device according to claim 1.

16. A projector comprising the piezoelectric driving device according to claim 1.

17. A piezoelectric motor comprising:
 a piezoelectric driving device, the piezoelectric driving device including:
  three axes orthogonal to each other being defined as an X axis, a Y axis, and a Z axis;
  a first substrate having a first principal surface, the first principal surface extending along an X-Y plane along the X axis and the Y axis, the first substrate having a thickness along the Z axis, the first substrate having a first cleavage face along which the first substrate is broken when a force is applied to the first substrate, a broken surface of the first substrate being smooth and extending along the first cleavage face; and
  a piezoelectric element placed above the first substrate, the piezoelectric element being configured to deform so as to drive an object; and
 a driven part in contact with the piezoelectric driving device,
 wherein a cleavage direction of the first substrate is a crossing direction along which the first principal surface of the first substrate and the first cleavage face of the first substrate crosses,
 a direction in which a shear force is applied to the first substrate with respect to the first principal surface when the piezoelectric element moves is defined as a first shear force direction, and
 the cleavage direction of the first substrate and the first shear force direction do not coincide on the first principal surface of the first substrate.

18. The piezoelectric motor according to claim 17,
 wherein an angle formed by the cleavage direction of the first substrate and the shear force direction on the first principal surface of the first substrate is equal to or larger than 20°.

19. A robot comprising:
 a first arm;
 a second arm; and
 a joint connecting between the first arm and the second arm, the joint including a piezoelectric driving device, the piezoelectric driving device including:
  three axes orthogonal to each other being defined as an X axis, a Y axis, and a Z axis;
  a first substrate having a first principal surface, the first principal surface extending along an X-Y plane along the X axis and the Y axis, the first substrate having a thickness along the Z axis, the first substrate having a first cleavage face along which the first substrate is broken when a force is applied to the first substrate, a broken surface of the first substrate being smooth and extending along the first cleavage face; and
  a piezoelectric element placed above the first substrate, the piezoelectric element being configured to deform so as to drive one of the first arm or the second arm,
 wherein a cleavage direction of the first substrate is a crossing direction along which the first principal surface of the first substrate and the first cleavage face of the first substrate crosses,
 a direction in which a shear force is applied to the first substrate with respect to the first principal surface when the piezoelectric element moves is defined as a first shear force direction, and
 the cleavage direction of the first substrate and the first shear force direction do not coincide on the first principal surface of the first substrate.

20. The robot according to claim 19,
 wherein an angle formed by the cleavage direction of the first substrate and the shear force direction on the first principal surface of the first substrate is equal to or larger than 20°.

* * * * *